US011851742B2

(12) United States Patent
Aresta et al.

(10) Patent No.: US 11,851,742 B2
(45) Date of Patent: Dec. 26, 2023

(54) VAPOR DEPOSITION METHOD FOR PREPARING AN AMORPHOUS LITHIUM BOROSILICATE

(71) Applicant: ILIKA TECHNOLOGIES LIMITED, Romsey (GB)

(72) Inventors: Gianfranco Aresta, Southampton (GB); David Michael Laughman, Acton, MA (US); Brian Elliott Hayden, Lyndhurst (GB); Samuel Guerin, Southampton (GB)

(73) Assignee: ILIKA TECHNOLOGIES LIMITED, Romsey (GB)

(*) Notice: Subject to any disclaimer, the term of this patent is extended or adjusted under 35 U.S.C. 154(b) by 292 days.

(21) Appl. No.: 17/261,768

(22) PCT Filed: Aug. 29, 2019

(86) PCT No.: PCT/GB2019/052406
§ 371 (c)(1),
(2) Date: Jan. 20, 2021

(87) PCT Pub. No.: WO2020/044042
PCT Pub. Date: Mar. 5, 2020

(65) Prior Publication Data
US 2021/0262079 A1 Aug. 26, 2021

(30) Foreign Application Priority Data
Aug. 29, 2018 (GB) .................................... 1814039

(51) Int. Cl.
C23C 14/08 (2006.01)
C03C 3/064 (2006.01)
(Continued)

(52) U.S. Cl.
CPC .............. *C23C 14/08* (2013.01); *C03C 3/064* (2013.01); *C03C 4/14* (2013.01); *C23C 14/0021* (2013.01);
(Continued)

(58) Field of Classification Search
None
See application file for complete search history.

(56) References Cited

U.S. PATENT DOCUMENTS 4,374,162 A 2/1983 Takagi
4,933,058 A 6/1990 Bache
(Continued)

FOREIGN PATENT DOCUMENTS

CN 1359165 A 7/2002
CN 1773763 5/2006
(Continued)

OTHER PUBLICATIONS

Tatsumisago, et al., "Structure of rapidly quenched lithium phosphate glasses," Physics and Chemistry of Glasses, vol. 29, No. 2, Apr. 1988, pp. 63-66.
(Continued)

*Primary Examiner* — David P Turocy
(74) *Attorney, Agent, or Firm* — Renner, Otto, Boisselle & Sklar, LLP

(57) ABSTRACT

The present invention provides a vapour deposition method for preparing an amorphous lithium borosilicate compound or doped lithium borosilicate compound, the method comprising: providing a vapour source of each component element of the compound, wherein the vapour sources comprise at least a source of lithium, a source of oxygen, a source of boron and a source of silicon, and, optionally, a source of at least one dopant element; providing a substrate at a temperature of less than about 180° C.; delivering a flow
(Continued)

of said lithium, said oxygen, said boron and said silicon, and, optionally, said dopant element, wherein the rate of flow of said oxygen is at least about $8 \times 10^{-8}$ m$^3$/s; and co-depositing the component elements from the vapour sources onto the substrate wherein the component elements react on the substrate to form the amorphous compound.

15 Claims, 4 Drawing Sheets

(51) Int. Cl.
  *C03C 4/14* (2006.01)
  *C23C 14/00* (2006.01)
  *H01M 4/136* (2010.01)
  *H01M 4/1397* (2010.01)

(52) U.S. Cl.
  CPC ......... *H01M 4/136* (2013.01); *H01M 4/1397* (2013.01); *C03C 2204/00* (2013.01)

(56) References Cited

U.S. PATENT DOCUMENTS

| | | | |
|---|---|---|---|
| 5,016,563 | A | 5/1991 | Murakami et al. |
| 5,128,007 | A | 7/1992 | Matsunaga et al. |
| 5,338,625 | A | 8/1994 | Bates et al. |
| 5,804,054 | A | 9/1998 | Bhattacharya et al. |
| 6,017,654 | A | 1/2000 | Kumta et al. |
| 6,214,061 | B1 | 4/2001 | Visco et al. |
| 6,632,563 | B1 | 10/2003 | Krasnov |
| 6,863,699 | B1 | 3/2005 | Krasnov et al. |
| 6,982,132 | B1 | 1/2006 | Goldner et al. |
| 7,883,800 | B2 | 2/2011 | Vinatier et al. |
| 10,490,805 | B2 | 11/2019 | Smith et al. |
| 10,865,480 | B2 * | 12/2020 | Hayden ............... C03C 3/089 |
| 2001/0032666 | A1 | 10/2001 | Jenson |
| 2001/0041294 | A1 | 11/2001 | Chu et al. |
| 2002/0106456 | A1 | 8/2002 | Kugai |
| 2003/0186128 | A1 | 10/2003 | Singh |
| 2004/0058237 | A1 | 3/2004 | Higuchi |
| 2004/0258984 | A1 | 12/2004 | Ariel |
| 2005/0016458 | A1 | 1/2005 | Zhang |
| 2005/0130032 | A1 | 6/2005 | Krasnov et al. |
| 2005/0147890 | A1 | 7/2005 | Shembel et al. |
| 2009/0026065 | A1 | 1/2009 | Nukeaw |
| 2009/0057136 | A1 | 3/2009 | Wang et al. |
| 2009/0081554 | A1 | 3/2009 | Takada |
| 2010/0068617 | A1 | 3/2010 | Bedjaoui et al. |
| 2010/0104942 | A1 | 4/2010 | Lange |
| 2010/0261071 | A1 | 10/2010 | Lopatin |
| 2012/0058280 | A1 | 3/2012 | Chung |
| 2012/0058380 | A1 | 3/2012 | Wang et al. |
| 2012/0237835 | A1 | 9/2012 | Yada |
| 2012/0319034 | A1 | 12/2012 | Awano |
| 2013/0011738 | A1 | 1/2013 | Zhou |
| 2013/0136981 | A1 | 5/2013 | Peuchert |
| 2013/0189588 | A1 | 7/2013 | Yada et al. |
| 2014/0001412 | A1 | 1/2014 | Munnangi et al. |
| 2014/0178750 | A1 | 6/2014 | Anji Reddy et al. |
| 2015/0203975 | A1 | 7/2015 | Hoormann |
| 2016/0336583 | A1 * | 11/2016 | Smith ............... C23C 14/08 |
| 2016/0340772 | A1 * | 11/2016 | Smith ............... H01M 10/0525 |
| 2016/0340784 | A1 * | 11/2016 | Hayden ............ H01M 10/0525 |

FOREIGN PATENT DOCUMENTS

| | | |
|---|---|---|
| CN | 101479403 | 7/2009 |
| CN | 106495671 | 3/2017 |
| DE | 10342974 | 4/2005 |
| DE | 10355236 | 6/2005 |
| EP | 0454499 | 11/1996 |
| EP | 1305838 | 2/2007 |
| EP | 1900845 | 3/2008 |
| EP | 2824738 | 1/2014 |
| GB | 1595632 | 4/1978 |
| GB | 2493020 | 1/2013 |
| GB | 2493022 | 1/2013 |
| JP | S63-035493 | 2/1988 |
| JP | H04187759 | 12/1989 |
| JP | H01317199 | 7/1992 |
| JP | H08329944 | 12/1996 |
| JP | 2003277915 | 10/2003 |
| JP | 2005038844 | 2/2005 |
| JP | 2006-120437 | 5/2006 |
| JP | 2013-151721 | 8/2013 |
| JP | 2013-187024 | 9/2013 |
| JP | 2015-056208 | 3/2015 |
| JP | 2017-503913 A | 2/2017 |
| KR | 20030094759 | 12/2003 |
| KR | 20040098139 | 11/2004 |
| KR | 20080003679 | 1/2008 |
| WO | 2001073957 | 4/2001 |
| WO | 2005035620 | 4/2005 |
| WO | 2005038844 | 4/2005 |
| WO | 2013/011326 | 1/2013 |
| WO | 2013/011327 | 1/2013 |
| WO | 2015/104538 | 7/2015 |
| WO | 2015/104540 | 7/2015 |
| WO | 2017/216532 | 12/2017 |
| WO | 2020044042 | 3/2020 |

OTHER PUBLICATIONS

Joo et al.; "Thin film lithium ion conducting LiBSO solid electrolyte", Solid State Ionics, 2003, vol. 160, pp. 51-59.

Samuneva et al. Structure and optical properties of niobium silicate glasses. Journal of Non-crystalline solids. vol. 129, Issues 1-3. Mar. 1991, pp. 54-63.

Beal et al.; "High Throughput Methodology for Synthesis, Screening, and Optimization of Solid State Lithium Ion Electrolytes", ACS Combinatorial Science, 2011, vol. 13 Issue 4, pp. 375-38.

Wang et al.; "Synthesis, Crystal Structure, and Ionic Conductivity of a Polycrystalline Lithium Phosphorus Oxynitride with the y-Li3PO4 Structure", Journal of Solid State Chemistry, 1995, vol. 115(2), pp. 313-323, Abstract.

Park et al.; "Characterization of tin oxide/LiMn2O4 thin-film cell", Journal of Power Sources, 2000, vol. 88, pp. 250-254.

Chen et al.; "High rate performance of LiMn2O4 cathodes for lithium ion batteries synthesized by low temperature oxygen plasma assisted sol-gel process", Thin Solid Films, 2013, vol. 544, pp. 182-185.

Zhong et al.; "Synthesis and Electrochemistry of LiNixMn2—XO4" Journal of Electrochemical Society, 1997, vol. 144(1), pp. 205-213.

Hu et al.; "Influence of sputtering pressure on the structure and ionic conductivity of thin film amorphous electrolyte", Journal of Material Science, 2011, vol. 46, pp. 7588-7593.

Choi et al.; "Radio-Frequency Magnetron Sputtering Power Effect on the Ionic Conductivities of Lipon Films", Electrochemical and Solid-State Letters, 2002, vol. 5(1), pp. A14-A17.

Zhao et al.; "A solid-state electrolyte lithium phosphorus oxynitride film prepared by pulsed laser deposition", Thin Solid Films, 2002, vol. 415, pp. 108-113.

Muñoz, et al., "Composition and structure dependence of the properties of lithium borophosphate glasses showing boron anomaly." Journal of Non-Crystalline Solids, 355, 2009, pp. 2571-2577.

Miura, et al., "X-ray photoelectron spectroscopy of sodium borosilicate glasses," Journal of Non-Crystalline Solids, 290, 2001, pp. 1-14.

Tang et al.; "Comparative study of LiMn2O4 thin film cathode grown at high, medium and low temperatures by pulsed laser deposition", Journal of Solid State Chemistry, 2006, vol. 179 (12), pp. 3831-3838.

Thornton et al.; "Sputter Deposition Processes", Handbook of Deposition Technologies for Films and Coatings, 1994, second edition, pp. 249-272.

Wang et al.; "High power and capacity of LiNi0.5Mn1.5O4 thin films cathodes prepared by pulsed laser deposition", Electrochimica Acta. 2013, vol. 102, pp. 416-422.

(56) References Cited

OTHER PUBLICATIONS

Singh et al.; "Challenges in making of thin films for LixMnyO4 rechargeable lithium batteries for MEMS", Journal of Power Sources, 2001, vol. 97-98, pp. 826-831.
Jayanth Babu, et al.; "Microstructural and electrochemical properties of rf-sputtered LiMn2O4 thin film cathodes", Appl. Nanosci. 2012, vol. 2, pp. 401-407.
Baggetto et al.; "Fabrication and characterization of Li—Mn—Ni—O sputtered thin film high voltage cathodes for Li-ion batteries", Journal of Power Sources, 2012, vol. 211, pp. 108-118.
Tsuchiya, et al., Anomalous Behavior of Physical and Electrical Properties in Borophosphate Glasses Containing R2O and V2O5, Journal of Non-Crystalline Solids, 38 & 39, North-Holland Publishing Company, 1980, pp. 323-328.
Umesaki, et al., "A Structural Study of Rapidly Quenched Glasses in the System Li2O—SiO2," Journal of Non-Crystalline Solids, 106, 1988, pp. 77-80, North-Holland, Amsterdam.
Kowada, et al., "Raman Spectra of Rapidly Quenched Glasses in the Systems Li3BO3—Li4SiO4—Li3PO4 and Li4B2O5—Li6Si2O7—Li4P2O7," The Journal of Physical Chemistry, vol. 93, No. 5, 1989, pp. 2147-2151.
International Search Report and Written Opinion dated Dec. 9, 2019 for corresponding International Application No. PCT/GB2019/052406.
Julien, C. M.; Nazri, G. A., Chapter 1. Design and Optimisation of Solid State Batteries. In Solid State Batteries: Materials Design and Optimization, 1994, 49-51.
Bates, J. B.; Gruzalski, G. R.; Dudney, N. J.; Luck, C. F.; Yu, X., "Rechargeable Thin Film Lithium Batteries." Oak Ridge National Lab and Solid State Ionics 1993.
Tatsumisago, M.; Machida, N.; Minami, T., "Mixed Anion Effect in Conductivity of Rapidly Quenched Li4SiO4—Li3BO3 Glasses." Yogyo-Kyokai-Shi 1987, 95, (2), 197-201.
Machida, N.; Tatsumisago, M.; Minami, T., "Preparation of amorphous films in the systems Li2O2—SiO2 and Li2O—B2O3—SiO2 by RF-sputtering and their ionic conductivity." Yogyo-Kyokai-Shi 1987, 95, (1), 135-7.
Julien, C. M.; Nazri, G. A., "Chapter 4. Materials for electrolyte: Thin Films. In Solid State Batteries: Materials Design and Optimization", 1994.
Varshneya, A. K., Fundamentals of Inorganic Glasses, Academic Press, p. 33.
Guerin, S. and Hayden, B. E., "Physical Vapor Deposition Method for the High-Throughput Synthesis of Solid-State Material Libraries" Journal of Combinatorial Chemistry 8, 2006, pp. 66-73.
Umesaki, N., et al., Structure of Rapidly Quenched Glasses in the System Li2O—SiO2. Journal of Materials Science, 1993. 28(13): p. 3473-3481.
Muralidharan, et al., "AC conductivity studies of lithium borosilicate glasses: synthesized by sol-gel process with various concentrations of nitric acid as a catalyst," Materials Chemistry and Physics 88 (2004) 138-144.
Muralidharan, et al., "Sol-gel synthesis, characterization and impedance studies of lithium borosilicate glass," Materials Research Bulletin 39(11), Sep. 2004, Abstract only, https://www.researchgate.net/publication/240386040_Sol-gel_synthesis_characterization_and_impedance_studies_of_lithium_borosilicate_glass.
Kluvanek, et al., "Investigation of the conductivity of the lithium borosilicate glass system," Journal of Non-Crystalline Solids, 353, (2007), 2004-2007.
Kim, et al. "Effect of SiO2/B2O3 ratio on Li ion conductivity of a Li2O—B2O3—SiO2 glass electrolyte," Journal of Ceramic Processing Research, vol. 13, Special 1, (2012), s37-s41.
Guerin, et al., "Synthesis and Screening of Phase Change Chalcogenide Thin Film Materials for Data Storage," ACS Comb. Sci. 2017, 19, 478-491.
Glass, et al., "Anomalous dielectric behavior and reversible pyroelectricity in roller-quenched LiNbO3, and LiTaO3 glass," Applied Physics Letters, 31, (1977) 249.
Glass, et al., "Lithium ion conduction in rapidly quenched Li2O—Al2O3,Li2O—Ga2O3, and Li2O—Bi2—O3," Journal of Applied Physics, 51, (1980) 3756.
Yada, et al., "Dielectric Modification of 5V-Class Cathodes for High-Voltage All-Solid-State Lithium Batteries," Advanced Energy Materials 2014, 4, 1301416.
Glass, et al., "Ionic conductivity of quenched alkali niobate and tantalate glasses," J Appl Phys, 49, (1978) 4808.
Halil Sahan et al: "Improvement of the electrochemical performance of LiMn2O4 cathode active material by lithium borosilicate (LBS) surface coating for lithium-ion batteries", Journal of Alloys and Compounds., vol. 509, No. 11, Jan. 14, 2011 (Jan. 14, 2011), pp. 4235-4241, XP055394524, CH ISSN: 0925-8388, DOI: 10.1016/j.jallcom.2011.01.054, abstract, figure 1, p. 4236, lines 58-61.
Tatsumisago, et al., "Mixed Anion Effect in Conductivity of Rapidly Quenched Li4SiO4—Li3BO3 Glasses," Yogyo-Kyokai-Shi, 95 [2], 1987, pp. 197-201.
Ren et al.; "Oxide Electrolytes for Lithium Batteries", Journal of the American Ceramic Society, 98 [12] (2015) 3603-3623.
Bachman et al., "Inorganic Solid-State Electrolytes for Lithium Batteries: Mechanisms and Properties Governing Ion Conduction", Chemical Reviews, 116 (2016) 140-162.
Bates et al.; "A Stable Thin-Film Lithium Electrolyte: Lithium Phosphorus Oxynitride", Journal of the Electrochemical Society 144 [2] (1997) 524-533.
Guerin et al.; "Physical Vapor Deposition Method for the High-Throughput Synthesis of Solid-State Material Libraries", Journal of Combined Chemistry, 2006, vol. 8, pp. 66-73.
Zhu et al.; "First principles study on electrochemical and chemical stability of solid electrolyte-electrode interfaces in all-solid-state Li-ion batteries", Journal of Materials Chemistry A 2016 4 3253-3266; and supplementary information.
Tatsumisago, et al., "Rapid Quenching Technique Using Thermal-Image Furnace for Glass Preparation," Communications of the American Ceramic Society, Jul. 1981, pp. C97-C98.
N.S. Saetova et al: The influence of lithium oxide concentration on the transport properties of glasses in the Li2O—B2O3—SiO2 system11 , Journal of Non-Crystalline Solids., vol. 443, Apr. 22, 2016 (Apr. 22, 2016), pp. 75-81.
Liu, et al., " Mechanism of lithium storage in Si—O—C composite anodes," Journal of Power Sources 196, 2011, pp. 10667-10672, Changsha, People's Republic of China.
Jin, et al., "Raman Studies of Lithium Borophosphate Glasses," Journal of Non-Crystalline Solids 112, 1989, pp. 145-150, North-Holland, Amsterdam.
Wang, et al., "Structural role of lead in lead silicate glasses derived from XPS spectra," Journal of Non-Crystalline Solider 194, 1996, pp. 129-134.
Shiraishi, et al., "Study of the Surface Composition of Highly Smooth Lithium Deposited in Various Carbonate Electrolytes Containing HF," American Chemical Society, Langmuir, vol. 13, No. 13, 1997, pp. 3542-3549.
Rinke, et al., The mixed network former effect in glasses: solid state NMR and XPS structural studies of the glass system (Na2O)x(BPO4)1-x, Phys. Chem. Chem. Phys., www.rsc.org/pccp, 2011, 13, pp. 6552-6565.
Raskar, et al., The Mixed-Network Former Effect in Phosphate Glasses: NMR and XPS Studies of the Connectivity Distribution in the Glass System (NaPO3)1-x(B2O3)x, J. Phys. Chem. C, 2008, 112, pp. 12530-12539.
Nocun, "Structural studies of phosphate glasses with high ionic conductivity," Journal of Non-Crystalline Solids, 333, 2004, pp. 90-94.
Miyachi, et al., "Analysis of SiO Anodes for Lithium-Ion Batteries," Journal of The Electrochemical Society, 152, 10, 2005, pp. A2089-A2091.
Machida, et al., "Preparation of Amorphous Films in the Systems Li2O—SiO2 and Li2O—B2O3—SiO2 by Rf-Sputtering and Their Ionic Conductivity," Yogyo-Kyokai-Shi 95, 1987, pp. 135-137.
Konijnendijk, et al., "The Structure of Borosilicate Glasses Studied by Raman Scattering," Journal of Non-Crystalline Solids, 20, 1976, pp. 193-224, North-Holland, Amsterdam.

(56) References Cited

OTHER PUBLICATIONS

Goodenough, "Design considerations," Solid State Ionics 69, 1994, pp. 184-198.
Maia, et al., Electrical Conductivity and relaxation frequency of lithium borosilicate glasses, Solid State Ionics 168, 2004, pp. 87-92.
Muralidharan, et al., "Sol-gel synthesis, structural and ion transport studies of lithium borosilicate glasses," Solid State Ionics 166, 2004, pp. 27-38.
Satyanarayanaa, et al., "Investigation of sol-gel route in the synthesis of lithium ion conducting glasses," Solid State Ionics, 86-88, 1996, pp. 543-546.
Tatsumisago, et al., "Raman spectra of rapidly quenched $Li_4SiO_4$—$Li_3BO_3$ glasses," Physics and Chem of Glasses 28, 1987, pp. 95-96.
Tatsumisago, et al., Structural Investigation of Rapidly Quenched $Li_2O$—$B_2O_3$ Glasses by Raman Spectroscopy, Yogyo-Kyokai-Shi 94 [5], 1986, pp. 464-469.
Levasseur, et al., "Elaboration and Characterization of Lithium Conducting Thin Film Glasses," Solid State Ionics 9 & 10, North Holland Publishing Company, 1983, pp. 1439-1444.
Efimov, "Vibrational spectra, related properties, and structure of inorganic glasses," Journal of Non-Crystalline Solids, 253, 1999, pp. 95-118.
Dalby, et al., "Resolution of bridging oxygen signals from O 1s spectra of silicate glasses using XPS: Implications for O and Si speciation," Geochimica et Cosmochimica Acta 71, www.elsevier.com/locate/gca, 2007, pp. 4297-4313.
Brooker, et al., "Raman and Infrared Spectral Studies of Anhydrous $Li_2CO_3$ and $Na_2CO_3$", The Journal of Chemical Physics, vol. 54, No. 11, Jun. 1, 1971, pp. 4788-4796.
Touati, et al., "Preparation and characterization of mesoporous lithium borosilicate material via the sol-gel process," Materials Science and Engineering, C, 29, 2009, pp. 1239-1244.
Muralidharan, et al., "Sol-gel synthesis, characterization and impedance studies of lithium borosilicate glass," Materials Research Bulletin, 39, Jan. 2004, pp. 1753-1762.
Touati, et al., "Structure and texture of heat-treated lithium borosilicate xerogel," Materials Chemistry and Physics, 101, 2007, pp. 352-356.
Meunier, et al., "New Positive-electrode Materials for Lithium Thin Film Secondary Batteries*," Materials Science and Engineering, B3, 1989, pp. 19-23.
Zhang, "A review of the electrochemical performance of alloy anodes for lithium-ion batteries," Journal of Power Sources, 196, 2011, pp. 13-24.
Kim, et al., "Laser-printed thick-film electrodes for solid-state rechargeable Li-ion microbatteries," Journal of Power Sources, 165, 2007, pp. 413-419.
Lee, et al., "Phase separation and electrical conductivity of lithium borosilicate glasses for potential thin film solid electrolytes," Journal of Power Sources, 162, 2006), pp. 1341-1345.
Wartena, et al., "Li-ion microbatteries generated by a laser direct-write method," Journal of Power Sources, 126, 2004, pp. 193-202.
Wang, et al., "A meso-macroporous borosilicate monolith prepared by a sol-gel method," Microporous and Mesoporous Materials, 151, 2012, pp. 250-254.
Creus, et al., "The Use of Ionic and Mixed Conductive Glasses in Microbatteries*," Materials Science and Engineering, B3, 1989, pp. 109-112.
Lee, et al., "Electrochemical performance of lithium/sulfur batteries with protected Li anodes," Journal of Power Sources, https://www.researchgate.net/publication/245105584, Jun. 2003.
Kim, et al., "Fabrication of a high lithium ion conducting lithium borosilicate glass," Journal of Non-Crystalline Solids, 357, 2011, pp. 2863-2867.
Tatsumisago, et al., "Ionic Conductivity of Rapidly Quenched Glasses with High Concentration of Lithium Ions," Journal of Non-Crystalline Solids, 95 & 96, 1987, pp. 857-864.
Tatsumisago, et al., "Preparation of Rapidly Quenched Glasses in Pseudobinary Systems Composed of Lithium Ortho-Oxosalts," Journal of the American Ceramic Society, Nov. 1983, pp. C210-C211.
Kim, et al., "High voltage stability of $LiCoO_2$ particles with a nano-scale Lipon coating," Electrochimica Acta, 56, 2011, pp. 6573-6580.
Tatsumisago, "Raman Spectra of $Li_2O$—$SiO_2$ Glasses Prepared by Rapid Quenching," The Chemical Society of Japan, Chemistry Letters, 1986, pp. 1371-1374.
Goodenough, et al., "Challenges for Rechargeable Li Batteries," Chemistry of Materials Review, 22, 2010, pp. 587-603.
Manthiram, et al., "Lithium-Sulfur Batteries: Progress and Prospects," Advanced Materials, 27, 2015, pp. 1980-2006.
Zhu, et al., "Origin of Outstanding Stability in the Lithium Solid Electrolyte Materials: Insights from Thermodynamic Analyses Based on First-Principles Calculations," ACS Applied Materials & Interfaces, 7, 2015, pp. 23685-23693.
Reddy, et al., "Metal Oxides and Oxysalts as Anode Materials for Li Ion Batteries," Chemical Reviews, 113, 2013, pp. 5364-5457.
Bates, et al., CRADA Final Report for CRADA No. ORNL90-0038, Development of Lithium Microbattery Packaging Technology ERKTS01, Oak Ridge National Laboratory, Martin Marietta, pp. 1-7.
Chryssikos, et al., "On the Structure of Alkali Borate Glasses Approaching the Orthoborate Composition," Materials Science and Engineering, B7, 1990, pp. 1-4, The Netherlands.
Ito, et al., "Ionic Conductivity of $Li_2O$—$B_2O_3$ Thin Films," Journal of Non-Crystalline Solids, 57, 1983, pp. 389-400.
Rim, et al., "Synthesis and Conductivity of the Lithium-rich Borosilicate Glass System," Journal of the Korean Physical Sociey, vol. 61, No. 6, Sep. 2012, pp. 988-991.
Neyret, et al. "Ionic transport of alkali in borosilicate glass. Role of alkali nature on glass structure and on ionic conductivity at the glassy state," Journal of Non-Crystaline Solids, 400, 2015, pp. 74-91.
Translation of the Office Action dated Feb. 9, 2023, in corresponding Chinese Application No. 201980054440.6.
First Examination Report issued to the corresponding Japanese application No. 2021-502892 dated Aug. 15, 2023.

\* cited by examiner

VAPOR DEPOSITION METHOD FOR PREPARING AN AMORPHOUS LITHIUM BOROSILICATE

This application is a national phase of International Application No. PCT/GB2019/052406 filed Aug. 29, 2019, which claims priority to GB Application No. 1814039.2 filed Aug. 29, 2018, all of which are hereby incorporated herein by reference in their entireties.

FIELD OF THE INVENTION

The present invention relates to a method for preparing amorphous lithium borosilicate or doped lithium borosilicate compounds by vapour deposition.

BACKGROUND TO THE INVENTION

The deposition of materials in thin film form is of great interest owing to the many applications of thin films, and a range of different deposition techniques are known. Various techniques are more or less suitable for particular materials, and the quality, composition and properties of the thin film produced typically depends greatly on the process used for its formation. Consequently, much research is devoted to developing deposition processes that can produce thin films appropriate for specific applications.

An important application of thin film materials is in solid state thin film cells or batteries, such as lithium ion cells. Such batteries are composed of at least three components. Two active electrodes (the anode and the cathode) are separated by an electrolyte. Each of these components is formed as a thin film, deposited in sequence on a supporting substrate. Additional components such as current collectors, interface modifiers and encapsulations may also be provided. In manufacture, the components may be deposited in the order of cathode current collector, cathode, electrolyte, anode, anode current collector and encapsulation, for example.

In the lithium ion example, the anode and the cathode are capable of reversibly storing lithium. Other requirements of the anode and cathode materials are high gravimetric and volumetric storage capacities which can be achieved from a low mass and volume of material, while the number of lithium ions stored per unit should be as high as possible. The materials should also exhibit acceptable electronic and ionic conduction so that ions and electrons can move through the electrodes during the battery charge and discharge process.

Otherwise, the anode, cathode and electrolyte require different properties. The cathode should present reversible lithium intercalation at high potentials, while the anode should present reversible lithium intercalation at low potentials.

The electrolyte physically separates the anode and cathode, so it must have extremely low electrical conductivity to prevent short circuiting of the battery. However, to enable reasonable charge and discharge properties, the ionic conductivity of the material must be as high as possible. Furthermore the material must be stable during the both the manufacturing and cycling processes and not react with either the cathode or the anode.

A significant challenge in solid state battery development has been the identification of solid electrolytes with sufficiently high ionic conductivity, low electronic conductivity, low mechanical stress resulting from required electrochemical cycling and reproducible high yield production methods.

Both crystalline and non-crystalline (amorphous) materials have been considered as electrolytes. Crystalline materials such as lithium lanthanum titanate (LLTO), thio-LISICON, NASICON-type ($Li_{1+x+y}Al_x(Ti,Ge)_{2-x}Si_yP_{3-y}O_{12}$), and $Li_{10}GeP_2S_{12}$ generally exhibit excellent ionic conductivity (for example up to $1.2 \times 10^{-2}$ S cm$^{-1}$ in the case of $Li_{10}GeP_2S_{12}$) so appear to be good candidates for electrolytes. However, these materials present problems when applied to battery systems. In the case of the oxides (LLTO, thio-LISICON and NASICON-type) the transition metals within the electrolyte are prone to reduction which causes the material to exhibit electronic conductivity and thus short circuit the battery. The sulphide systems, such as $Li_{10}GeP_2S_{12}$, present extremely high conductivities but are prone to decomposition when exposed to air and water, causing the release of toxic $H_2S$ and a deterioration in performance. Furthermore, both oxide and sulphide crystalline electrolytes require extremely high processing temperatures. For these reasons crystalline electrolytes have not been utilised in commercial thin film battery systems.

Amorphous electrolytes such as lithium phosphorous oxynitride (LiPON), lithium silicate and lithium borosilicates exhibit much lower levels of ionic conductivity. Although the optimum conductivity of these materials is approximately two orders of magnitude lower than that of the crystalline materials, this has been determined to be acceptable if the electrolyte is less than $1 \times 10^{-6}$ m thick (Julien, C. M.; Nazri, G. A., Chapter 1. Design and Optimisation of Solid State Batteries. In *Solid State Batteries: Materials Design and Optimization*, 1994). LiPON has an acceptable ionic conductivity of $3 \times 10^{-6}$ S cm$^{-1}$ and has been shown to be stable in air and when cycled against lithium. For these reasons, coupled with its ease of manufacture, it has been widely adopted in the first generation of solid state batteries (Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993; Bates, J. B.; Dudney, N. J.; Neudecker, B.; Gruzalski, G. R.; Luck, C. F. Thin Film Battery and Method for Making Same, U.S. Pat. No. 5,338,625). The amorphous nature of these electrolytes is critical to their performance; crystalline LiPON has an ionic conductivity seven orders of magnitude lower than the amorphous material.

Hence, amorphous electrolytes are of great interest. An alternative to LiPON is amorphous lithium borosilicate. Amorphous lithium borosilicate materials with ionic conductivity comparable to LiPON have been produced, but by methods requiring rapid quenching (Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95, (2), 197-201). This synthetic method gives rise to irregular 'splats' of glass, which are not suitable for processing into thin film batteries. Synthesis by sputtering of similar compositions has been attempted in thin films, but these were not successful, resulting in materials with significantly reduced conductivities when compared to the rapidly quenched glass (Machida, N.; Tatsumisago, M.; Minami, T., Preparation of amorphous films in the systems $Li_2O_2$—$SiO_2$ and $Li_2O$—$B_2O_3$—$_{Si}O_2$ by RF-sputtering and their ionic conductivity. *Yogyo-Kyokai-Shi* 1987, 95, (1), 135-7).

Many different thin film deposition methods have been proposed to date, which suffer from a range of drawbacks. Synthetic routes to thin films, which are generally referred to using the umbrella term of 'physical vapour deposition' include pulsed laser deposition, flash evaporation, sputtering and thermal evaporation, the most widespread method being sputtering. In this method a target of a particular composition is sputtered using plasma formed over the target; the resulting vapour condenses on a substrate, thereby forming the thin film. Sputtering involves the deposition of materials directly from a target. The product of the sputter varies and may include dimers, trimers or higher order particles.

An alternative is thermal evaporation directly from the elements, but this is uncommon. Julien and Nazri (Julien, C. M.; Nazri, G. A., Chapter 4. Materials for electrolyte: Thin Films. In *Solid State Batteries: Materials Design and Optimization*, 1994) allude to an attempt to synthesize $B_2O_3$-$xLi_2O$-$yLi_nX$ (X=I, Cl, $SO_4$ and n=1,2) directly from the elements, but no results are reported and the authors comment that "the difficulties in implementing this technique stay in enhancing the oxygen pumping, avoiding the high oxygen reactivity with the heated parts of the system, and making available an oxygen monoatomic source in order to enhance oxygen reactions on the surface".

Nevertheless, the present inventors have previously demonstrated the synthesis of phosphorus-containing materials directly from the constituent elements (WO 2013/011326; WO 2013/011327). However, a complexity in this process is the use of a cracker to break down phosphorus so as to enable the formation of phosphates. The synthesis of cathode (lithium iron phosphate—example 5, lithium manganese phosphate—example 7) and electrolyte materials ($Li_3PO_4$—example 1 and nitrogen doped $Li_3PO_4$—example 6) is disclosed. The deposited materials are amorphous; annealing is used to crystallise the cathode materials. Although this work demonstrates two of the three basic building blocks for producing a thin film cell, it does not demonstrate an operational cell. Furthermore, the ionic conductivities demonstrated in this work are too low to enable a cell to function correctly at room temperature.

The efforts required to overcome these many difficulties in the various deposition processes and the complexities involved in developing new materials mean that the vast majority of thin film batteries are limited to using LiPON as an electrolyte, deposited as a thin film by sputtering. Clearly, improved methods of making thin films of other electrolyte materials are desirable so that thin film battery technology can be developed and enhanced.

It was found in WO 2015/104540 that samples of amorphous lithium-containing oxides and oxynitrides can be successfully fabricated by depositing vapour phase component elements directly onto a substrate which has been heated to a temperature of at least 180° C. Heating of the substrate to about 180° C. or above when one or more of the component elements is a glass-forming element has been found to create the necessary conditions for the component elements to successfully react on the substrate surface to form the compound, but does not cause the compound to crystallise. Stable, good quality amorphous compounds with useful properties are formed. However, it was not considered possible to prepare the compositions using a vapour deposition method at a low temperature of below 180° C. The use of this high temperature in the preparation of the composites suffers from drawbacks when the composite is applied to a lithium-containing electrode or electrolyte, as the melting point of lithium is about 180.5° C.

In view of the above, there is a need for a process enabling the reliable and reproducible preparation of amorphous lithium borosilicate and doped lithium borosilicate compounds, particularly in the form of thin films, that can be carried out at a relatively low temperature whilst maintaining an acceptable ionic conductivity.

SUMMARY OF THE INVENTION

According to a first aspect of the invention, there is provided a vapour deposition method for preparing an amorphous lithium borosilicate compound or doped lithium borosilicate compound, the method comprising:
    providing a vapour source of each component element of the compound, wherein the vapour sources comprise at least a source of lithium, a source of oxygen, a source of boron and a source of silicon, and, optionally, a source of at least one dopant element;
    providing a substrate at a temperature of less than about 180° C.;
    delivering a flow of said lithium, said oxygen, said boron and said silicon, and, optionally, said dopant element, wherein the rate of flow of said oxygen is at least about $8\times10^{-8}$ $m^3/s$; and
    co-depositing the component elements from the vapour sources onto the substrate wherein the component elements react on the substrate to form the amorphous compound.

According to a second aspect of the invention, there is provided a composition comprising an amorphous lithium borosilicate compound or doped lithium borosilicate compound, wherein the composition is obtained or obtainable by depositing the amorphous compound on a substrate using a vapour deposition method according to the first aspect of the invention.

According to a third aspect of the invention, there is provided a method of making a surface-modified electrode by a vapour deposition process, the electrode comprising an electrode active material, wherein a surface of said electrode is modified by an amorphous lithium borosilicate compound or doped lithium borosilicate compound, wherein the method comprises:
    (a) providing a vapour source of each component element of the amorphous compound, wherein the vapour sources comprise at least a source of lithium, a source of oxygen, a source of boron and a source of silicon, and, optionally, a source of at least one dopant element;
    (b) providing an electrode at a temperature of less than about 180° C.;
    (c) delivering a flow of said lithium, said oxygen, said boron and said silicon, and, optionally, said dopant element, wherein the rate of flow of said oxygen is at least about $8\times10^{-8}$ $m^3/s$; and
    (d) co-depositing the component elements from the vapour sources onto the electrode, wherein the component elements react on the electrode to form the amorphous compound.

According to a fourth aspect of the invention, there is provided a surface-modified electrode obtained or obtainable by a method according to the third aspect of the invention.

According to a fifth aspect of the invention, there is provided a battery comprising:
    an electrolyte;
    a negative electrode; and
    a positive electrode;
wherein at least one of the negative electrode or positive electrode is a surface-modified electrode, wherein the surface-modified electrode is according to the fourth aspect of the invention.

According to a sixth aspect of the invention, there is provided a method of making a battery, the method comprising depositing an electrolyte of the battery as a layer of an amorphous lithium borosilicate compound or doped lithium borosilicate compound using a vapour deposition method according to the first aspect of the invention.

According to a seventh aspect of the invention, there is provided a battery comprising:
  a positive electrode;
  a negative electrode; and
  an electrolyte;
wherein the electrolyte is in the form of a layer of an amorphous lithium borosilicate compound or doped lithium borosilicate compound deposited on a substrate using a vapour deposition method according to the first aspect of the invention.

For ease of reference, the above and further aspects of the invention are now discussed under appropriate section headings. However, the teachings under each section are not necessarily limited to each particular section.

BRIEF DESCRIPTION OF THE DRAWINGS

Embodiments of the invention will now be described, by way of example only, with reference to accompanying drawings, in which.

DETAILED DESCRIPTION

Definitions

Figure 1:
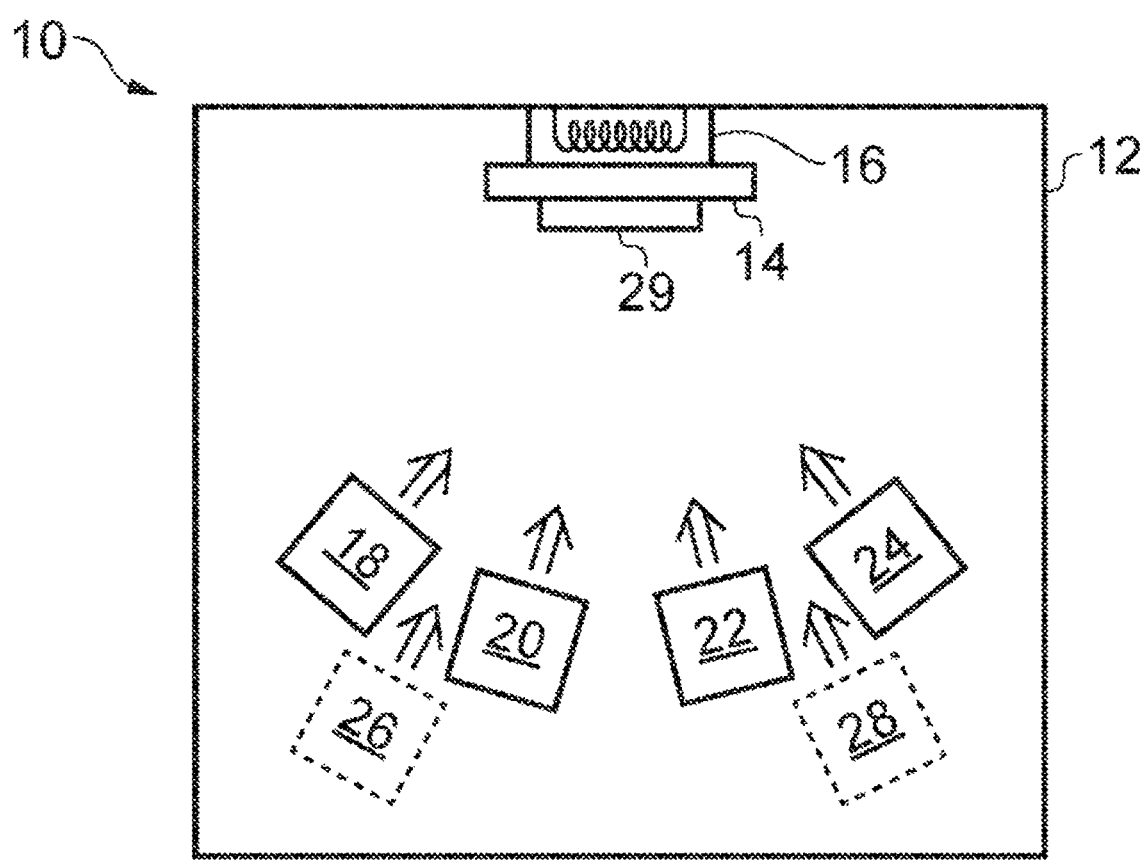
FIG. 1 shows a schematic representation of an example apparatus suitable for implementing a method according to embodiments of the invention.

As used herein, ranges of values set forth herein as "X to Y" or "between X and Y" are inclusive of the end values X and Y.

As used herein, the term "battery" is taken to be synonymous with the term "cell", and is a device capable of either generating electrical energy from chemical reactions or facilitating chemical reactions through the introduction of electrical energy.

Method

The invention provides a method for preparing an amorphous lithium borosilicate (LiBSiO) compound or doped lithium borosilicate compound. As described herein, the method is a vapour deposition method. The method comprises:
  providing a vapour source of each component element of the compound, wherein the vapour sources comprise at least a source of lithium, a source of oxygen, a source of boron and a source of silicon, and, optionally, a source of at least one dopant element;
  providing a substrate at a temperature of less than about 180° C.;
  delivering a flow of said lithium, said oxygen, said boron and said silicon, and, optionally, said dopant element, wherein the rate of flow of said oxygen is at least about $8 \times 10^{-8}$ m$^3$/s; and
  co-depositing the component elements from the vapour sources onto the substrate wherein the component elements react on the substrate to form the amorphous compound.

The method according to the present invention offers a number of advantages compared to known methods for the preparation of amorphous lithium borosilicate or doped lithium borosilicate compounds, and in particular thin films. In particular, previous evidence demonstrated that to produce amorphous lithium borosilicate or doped lithium borosilicate, a high temperature of above 180° C. was required in order to obtain a material having an acceptable ionic conductivity of $>1 \times 10^{-7}$ S/cm to render it suitable for use in batteries. However, the present inventors surprisingly found that, by careful modification of the flow rate of oxygen vapour during the process, an amorphous compound could be prepared using a vapour deposition method that does not require the substrate to be heated to such a high temperature whilst still maintaining an acceptable ionic conductivity. This was not previously considered possible when utilising such low temperatures. This low-temperature method thus offers the potential for using such vapour deposition methods for depositing amorphous lithium borosilicate or doped lithium borosilicate compounds on lithium metal or composite electrodes containing a low melting temperature polymeric or other component. As the skilled person will appreciate, the melting temperature of lithium is 180.5° C., and thus a substrate temperature of less than about 180° C. is desirable when the substrate is lithium metal.

Therefore, it has been surprisingly found that a vapour deposition method as described herein enables the preparation of an amorphous lithium borosilicate or doped lithium borosilicate compound using lower temperatures, whilst still providing an acceptable level of ionic conductivity ($\geq 1 \times 10^{-7}$ S/cm).

The ability to deposit amorphous lithium borosilicate and doped lithium borosilicate compounds at temperatures below about 180° C. while retaining an ionic conductivity above $1 \times 10^{-7}$ S/cm (and preferably even above $1 \times 10^{-6}$ S/cm), is of value as the reduction in synthesis temperature while maintaining the ionic conductivity presents the possibility of using this route to deposit these compounds as layers on top of lithium metal for applications relating to electrode protection, and in particular anode protection, (against the formation of parasitic solid electrolyte interphases (SEIs) such as in lithium sulfur, or lithium ion, or lithium air batteries), or the degradation mechanisms associated with the formation of lithium dendrites at the lithium metal/liquid electrolyte interface. Further by widening the deposition temperature window, coefficient of thermal expansion (CTE) induced mismatch between the compounds such as LiBSiO and neighbouring materials can be decreased, thereby reducing the potential for degradation effects associated with differential volume change (such as contraction) during cooling to room temperature post deposition.

Preferably, the vapour source of oxygen is a vapour source of atomic oxygen.

The use of atomic oxygen is preferred in comparison to, for example, molecular oxygen, as it is thought that the higher reactivity of atomic oxygen results in increased deposition rates and/or greater uniformity of the deposited compound across the substrate.

Without wishing to be bound, it is thought that by changing the abundance of atomic oxygen in the deposition chamber by modifying the flow rate of oxygen into the chamber, the oxygen chemical potential is affected, thereby influencing the reaction pathways adopted by the evaporated elements (such as Li, B, Si) as they arrive at the substrate surface in the course of combining to yield, for example, a lithium borosilicate electrolyte material(s).

In the context of this disclosure, the term "element" means "element of the periodic table". The lithium borosilicate compounds formed according to the invention therefore comprise component elements including lithium (Li) and oxygen (O). Also included are glass-forming elements, which include at least boron (B) and silicon (Si). In addition, dopant elements may also optionally be included. These may include, for example, nitrogen (N), sulfur (S), phosphorus (P), germanium (Ge), aluminium (Al), arsenic (As), titanium (Ti), aluminium (Al), zirconium (Zr), lead (Pb), gallium (Ga), tin (Sn), indium (In), bismuth (Bi), tungsten (W), niobium (Nb), tantalum (Ta), vanadium (V) and antimony (Sb) or combinations thereof. Other component elements will depend on the particular compound being formed, but in all cases each element in the compound is provided separately in the form of a vapour (or combined into a mixed vapour or plasma if appropriate), and each vapour is deposited onto a common substrate.

Also in the context of this disclosure, the term "amorphous lithium borosilicate compound" means "an amorphous compound containing lithium, oxygen, boron and silicon", and the term "amorphous doped lithium borosilicate compound" means "a compound containing lithium, oxygen, boron, silicon and one or more other dopant elements", where "a compound" is "a substance or material formed by the combination of two or more elements in fixed or substantially fixed proportions by a chemical reaction" (it being understood that in many cases, the elements are not present within the compound in precisely stoichiometric proportions). For the avoidance of doubt, the expression "an amorphous lithium borosilicate compound or doped lithium borosilicate compound" means "an amorphous lithium borosilicate compound or an amorphous doped lithium borosilicate compound".

In some embodiments, the lithium borosilicate compound and the doped lithium borosilicate compound does not contain phosphorus.

In the context of this disclosure, the term "amorphous" means "a solid that is not crystalline", i.e. that has no long range order in its lattice. It has been found that, according to the methods of the present invention, a desired compound can be deposited in amorphous form if one or more of the component elements from which the compound is deposited is a glass-forming element. Boron (B) and silicon (Si) are glass-forming elements that are included in lithium borosilicate compounds (and doped lithium borosilicate compounds). Other examples of glass-forming elements that may be included as dopant elements in the compounds include germanium (Ge), aluminium (Al), arsenic (As), titanium (Ti), aluminium (Al), zirconium (Zr), tungsten (W), niobium (Nb), tantalum (Ta), vanadium (V) and antimony (Sb) (Varshneya, A. K., *Fundamentals of Inorganic Glasses*, Academic Press, page 33).

Therefore, in some embodiments, the vapour sources comprise at least a source of lithium, at least a source of oxygen, at least a source of boron and at least a source of silicon. In some embodiments, the vapour sources may further comprise a source or sources of one or more of the following dopant elements: nitrogen, germanium, aluminium, arsenic, titanium, aluminium, zirconium, tungsten, niobium, tantalum, vanadium and antimony. As described herein, the sources of boron and silicon are sources of glass-forming elements.

In some embodiments, the amorphous compound is lithium borosilicate. In some embodiments, the lithium borosilicate consists essentially of a system of lithium oxide in combination with silicon oxide and/or boron oxide. In some embodiments, the lithium borosilicate consists essentially of a system of lithium oxide in combination with silicon oxide and/or boron oxide, wherein said lithium borosilicate comprises between 70-83 atomic % lithium based on the combined atomic percentages of lithium, boron and silicon. Typically, said lithium borosilicate is a glass. Preferably, the lithium borosilicate composition consists essentially of a system of lithium oxide in combination with silicon oxide and boron oxide, wherein said lithium borosilicate comprises between 70-81 atomic % lithium based on the combined atomic percentages of lithium, boron and silicon, and wherein said lithium borosilicate is a glass. Preferably, the lithium borosilicate composition consists essentially of a system of lithium oxide in combination with silicon oxide and boron oxide, wherein said lithium borosilicate comprises between 70-80 atomic % lithium based on the combined atomic percentages of lithium, boron and silicon, and wherein said lithium borosilicate is a glass.

In some embodiments, the amorphous compound is lithium borosilicate comprising 70-83 atomic % lithium based on the combined atomic percentages of lithium, boron and silicon. In some embodiments, the amorphous compound is lithium borosilicate comprising 70-81 atomic % lithium based on the combined atomic percentages of lithium, boron and silicon. In some embodiments, the amorphous compound is lithium borosilicate comprising 70-80 atomic % lithium based on the combined atomic percentages of lithium, boron and silicon. In some embodiments, the amorphous compound is lithium borosilicate comprising 74-83 atomic % lithium based on the combined atomic percentages of lithium, boron and silicon. In some embodiments, the amorphous compound is lithium borosilicate comprising 75-78 atomic % lithium based on the combined atomic percentages of lithium, boron and silicon. In some embodiments, the amorphous compound is lithium borosilicate comprising 76-77 atomic % lithium based on the combined atomic percentages of lithium, boron and silicon. In some embodiments, the amorphous compound is lithium borosilicate comprising 81-83 atomic % lithium based on the combined atomic percentages of lithium, boron and silicon.

In some embodiments, the amorphous compound is lithium borosilicate comprising 1-25 atomic % boron based on the combined atomic percentages of lithium, boron and silicon. In some embodiments, the amorphous compound is lithium borosilicate comprising 5-23 atomic % boron based on the combined atomic percentages of lithium, boron and silicon. In some embodiments, the amorphous compound is lithium borosilicate comprising 8-20 atomic % boron based on the combined atomic percentages of lithium, boron and silicon. In some embodiments, the amorphous compound is lithium borosilicate comprising 8-10 atomic % boron based on the combined atomic percentages of lithium, boron and silicon.

In some embodiments, the amorphous compound is lithium borosilicate comprising 1-25 atomic % silicon based on the combined atomic percentages of lithium, boron and silicon. In some embodiments, the amorphous compound is lithium borosilicate comprising 5-20 atomic % silicon based on the combined atomic percentages of lithium, boron and silicon. In some embodiments, the amorphous compound is lithium borosilicate comprising 8-19 atomic % silicon based on the combined atomic percentages of lithium, boron and silicon. In some embodiments, the amorphous compound is lithium borosilicate comprising 10-16 atomic % silicon based on the combined atomic percentages of lithium, boron and silicon. In some embodiments, the amorphous compound is lithium borosilicate comprising 14-16 atomic % silicon based on the combined atomic percentages of lithium, boron and silicon. In some embodiments, the amorphous compound is lithium borosilicate comprising 8-15 atomic % silicon based on the combined atomic percentages of lithium, boron and silicon.

In some embodiments, the amorphous compound is a lithium borosilicate glass defined as a system of lithium oxide in combination with silicon oxide and/or boron oxide, wherein the mol % of said lithium borosilicate glass is between 70.9 mol % $Li_2O$-0.0 mol % $B_2O_3$-29.1 mol % $SiO_2$; 53.8 mol % $Li_2O$-0.0 mol % $B_2O_3$-46.2 mol % $SiO_2$; 83.0 mol % $Li_2O$-17.0 mol % $B_2O_3$-0.0 mol % $SiO_2$; and 70.0 mol % $Li_2O$-30.0 mol % $B_2O_3$-0.0 mol % $SiO_2$. In a further embodiment, the lithium borosilicate glass is between 79.6 mol % $Li_2O$-12.2 mol % $B_2O_3$-8.2 mol % $SiO_2$; 60.3 mol % $Li_2O$-12.1 mol % $B_2O_3$-27.6 mol % $SiO_2$; 73.8 mol % $Li_2O$-3.8 mol % $B_2O_3$-22.4 mol % $SiO_2$; and 62.2 mol % $Li_2O$-15.6 mol % $B_2O_3$ 22.2 mol % $SiO_2$. In another embodiment, the lithium borosilicate glass is between 70.9 mol % $Li_2O$-0.0 mol % $B_2O_3$-29.1 mol % $SiO_2$; 66.7 mol % $Li_2O$-0.0 mol % $B_2O_3$-33.3 mol % $SiO_2$; 83.0 mol % $Li_2O$-17.0 mol % $B_2O_3$-0.0 mol % $SiO_2$; and 75.0 mol % $Li_2O$-25.0 mol % $B_2O_3$ 0.0 mol % $SiO_2$.

In some embodiments, the amorphous compound is a lithium borosilicate composition, wherein said lithium borosilicate consists essentially of a system of lithium oxide, silicon oxide and boron oxide, wherein said lithium borosilicate comprises between 70-83 atomic % lithium based on the combined atomic percentages of lithium, boron and silicon. Typically, said lithium borosilicate is a glass. In one embodiment, the amorphous compound is a lithium borosilicate composition, wherein said lithium borosilicate consists essentially of a system of lithium oxide, silicon oxide and boron oxide, wherein said lithium borosilicate comprises between 70-81 atomic % lithium based on the combined atomic percentages of lithium, boron and silicon. In one embodiment, the amorphous compound is a lithium borosilicate composition, wherein said lithium borosilicate consists essentially of a system of lithium oxide, silicon oxide and boron oxide, wherein said lithium borosilicate comprises between 70-80 atomic % lithium based on the combined atomic percentages of lithium, boron and silicon. In one embodiment, the amorphous compound is a lithium borosilicate composition, wherein said lithium borosilicate consists essentially of a system of lithium oxide, silicon oxide and boron oxide, wherein said lithium borosilicate comprises between 74-80 atomic % lithium based on the combined atomic percentages of lithium, boron and silicon. In one embodiment, the amorphous compound is a lithium borosilicate composition, wherein said lithium borosilicate consists essentially of a system of lithium oxide, silicon oxide and boron oxide, wherein said lithium borosilicate comprises between 81-83 atomic % lithium based on the combined atomic percentages of lithium, boron and silicon.

In some embodiments, the amorphous compound is a lithium borosilicate composition, wherein said lithium borosilicate consists essentially of a ternary system of lithium oxide, silicon oxide and boron oxide, wherein said lithium borosilicate comprises between 70-83 atomic % lithium based on the combined atomic percentages of lithium, boron and silicon. Typically, said lithium borosilicate is a glass. In one embodiment, the amorphous compound is a lithium borosilicate composition, wherein said lithium borosilicate consists essentially of a ternary system of lithium oxide, silicon oxide and boron oxide, wherein said lithium borosilicate comprises between 70-81 atomic % lithium based on the combined atomic percentages of lithium, boron and silicon. In one embodiment, the amorphous compound is a lithium borosilicate composition, wherein said lithium borosilicate consists essentially of a ternary system of lithium oxide, silicon oxide and boron oxide, wherein said lithium borosilicate comprises between 74-80 atomic % lithium based on the combined atomic percentages of lithium, boron and silicon. In one embodiment, the amorphous compound is a lithium borosilicate composition, wherein said lithium borosilicate consists essentially of a ternary system of lithium oxide, silicon oxide and boron oxide, wherein said lithium borosilicate comprises between 81-83 atomic % lithium based on the combined atomic percentages of lithium, boron and silicon.

It will be appreciated that small amounts of other atoms may be present in the lithium borosilicate material as described herein. In such embodiments, the compound may be described as a doped lithium borosilicate compound. Such other atoms may be present in the compound provided that such amounts of other atoms do not affect the properties of the lithium borosilicate material. Such traces of other atoms may substitute for any of Li, B, O and/or Si, preferably for B and/or Si.

Typical examples of atoms (dopants) which may substitute for Li, B, O and/or Si (preferably for B and/or Si) in the structure of the lithium borosilicate material include N, S, Ge, Al, P, Ti, V, Zr, Pb, Ga, As, Sn, In, Sb, Bi, Nb, Ta and W. Preferred examples of atoms which may substitute for Li, B, O and/or Si (preferably for B and/or Si) in the structure of the lithium borosilicate material include Al, Ti, Ge, P, V, W, S and N. In some embodiments, the dopant element is nitrogen, and the amorphous compound is nitrogen-doped lithium borosilicate.

In this regard, the term "consisting essentially of a system of lithium oxide in combination with silicon oxide and/or boron oxide" means that the total amount of lithium, boron and silicon atoms in the lithium borosilicate material, expressed as a molar percentage of the total amount of atoms other than oxygen in the material, is at least 90%, preferably at least 95%, preferably at least 97%, more preferably at least 98%, even more preferably at least 99%, still more preferably at least 99.5%, even more preferably at least 99.7%, still more preferably at least 99.8%, even more preferably at least 99.9%, still more preferably at least 99.95%, even more preferably at least 99.97%, still more preferably at least 99.98%, even more preferably at least 99.99%, still more preferably at least 99.995%, even more preferably at least 99.997%, still more preferably at least 99.998%, even more preferably at least 99.999%, still more preferably at least 99.9995%, even more preferably at least 99.9997%, still more preferably at least 99.9998%, even more preferably at least 99.9999%, and most preferably 100%.

In one embodiment, the amorphous compound is a lithium borosilicate compound, wherein said lithium borosilicate consists of a ternary system of lithium oxide, silicon oxide and boron oxide, wherein said lithium borosilicate comprises between 81-83 atomic % lithium based on the combined atomic percentages of lithium, boron and silicon. Typically, said lithium borosilicate is a glass.

It has been found that the lithium borosilicate glass as described herein exhibits high ionic conductivity while also exhibiting lower electronic conductivity. It has also been found that the lithium borosilicate glass as described herein is particularly stable in contact with lithium. These improved properties make the lithium borosilicate glass composition particularly suitable as a protectant for electrodes, particularly on the anode of a battery including the composition as a coating on the anode.

As described herein, the substrate is provided at a temperature of less than about 180° C. In some embodiments, the substrate is provided at a temperature of no greater than about 175° C. In some embodiments, the substrate is provided at a temperature of no greater than about 170° C. In some embodiments, the substrate is provided at a temperature of no greater than about 165° C. In some embodiments, the substrate is provided at a temperature of no greater than about 160° C. In some embodiments, the substrate is provided at a temperature of no greater than about 155° C. In some embodiments, the substrate is provided at a temperature of no greater than about 150° C. In some embodiments, the substrate is provided at a temperature of no greater than about 145° C. In some embodiments, the substrate is provided at a temperature of no greater than about 140° C. In some embodiments, the substrate is provided at a temperature of no greater than about 135° C. In some embodiments, the substrate is provided at a temperature of no greater than about 130° C. In some embodiments, the substrate is provided at a temperature of no greater than about 125° C. In some embodiments, the substrate is provided at a temperature of no greater than about 120° C. In some embodiments, the substrate is provided at a temperature of no greater than about 115° C. In some embodiments, the substrate is provided at a temperature of no greater than about 110° C. In some embodiments, the substrate is provided at a temperature of no greater than about 105° C. In some embodiments, the substrate is provided at a temperature of no greater than about 100° C. In some embodiments, the substrate is provided at a temperature of no greater than about 95° C. In some embodiments, the substrate is provided at a temperature of no greater than about 90° C. In some embodiments, the substrate is provided at a temperature of no greater than about 85° C. In some embodiments, the substrate is provided at a temperature of no greater than about 80° C.

In some embodiments, the substrate may be provided at a temperature of at least about 10° C. (but less than about 180° C.), such as at least about 20° C., such as at least about 30° C., such as at least about 40° C., such as at least about 50° C., such as at least about 60° C., such as at least about 65° C., such as at least about 70° C., such as at least about 75° C., such as at least about 80° C., such as at least about 85° C., such as at least about 90° C., such as at least about 95° C., such as at least about 100° C. In each of these embodiments, the temperature of the substrate is less than about 180° C.

In some embodiments, the substrate is provided at a temperature of from about 0° C. to less than about 180° C. In some embodiments, the substrate is provided at a temperature of from about 1° C. to about 179° C. In some embodiments, the substrate is provided at a temperature of from about 5° C. to about 175° C. In some embodiments, the substrate is provided at a temperature of from about 10° C. to about 160° C. In some embodiments, the substrate is provided at a temperature of from about 20° C. to about 150° C. In some embodiments, the substrate is provided at a temperature of from about 30° C. to about 130° C. In some embodiments, the substrate is provided at a temperature of from about 40° C. to about 120° C. In some embodiments, the substrate is provided at a temperature of from about 50° C. to about 115° C. In some embodiments, the substrate is provided at a temperature of from about 60° C. to about 110° C. In some embodiments, the substrate is provided at a temperature of from about 70° C. to about 110° C. In some embodiments, the substrate is provided at a temperature of from about 80° C. to about 110° C. In some embodiments, the substrate is provided at a temperature of from about 85° C. to about 105° C. In some embodiments, the substrate is provided at a temperature of from about 90° C. to about 100° C. In some embodiments, the substrate is provided at a temperature of from about 95° C. to about 100° C.

FIG. 1 shows a schematic representation of an example apparatus 10 suitable for implementing an embodiment method of the invention. The deposition may preferably be carried out within a vacuum system 12, which may be an ultrahigh vacuum system. A substrate 14 of a desired material (depending on the intended purpose of the deposited amorphous compound) is mounted within the vacuum system 12. The substrate is provided at a temperature of less than about 180° C.; the temperature at which the substrate 12 is provided is discussed further above. The provision of the substrate at such temperature may be achieved by heating the substrate up to this maximum temperature using heater 16.

Also within the system (preferably a vacuum or high vacuum system) are a plurality of vapour sources, one source for each of the component elements in the desired thin film compound. A first vapour source 18 comprises a source of atomic oxygen, such as an oxygen plasma source. A second vapour source 20 comprises a source of lithium vapour. A third vapour source 22 comprises a source of vapour of glass-forming element boron. A fourth vapour source 24 comprises a source of vapour of glass-forming element silicon. Any number of other vapour sources (such as 26, 28, shown in phantom) may optionally be included depending on the number of elements comprised in the compound material of interest. For example, if the compound is nitrogen-doped lithium borosilicate, one of the vapour sources may be a source of nitrogen. Alternatively, in a case where oxygen is provided from a plasma source, the nitrogen may be introduced though the plasma source to create a mixed nitrogen-oxygen plasma.

The nature of each vapour source will depend on the element it delivers, and also the amount of control required over the rate of delivery (i.e. flow rate or flux). A source may be a plasma source, for example, particularly in the case of the oxygen vapour source. A plasma source delivers plasma-phase oxygen, i.e. a flux of oxygen atoms, radicals and/or ions. The source may be a radio frequency (RF) plasma source, for example. Atomic oxygen is advantageous when depositing compounds that comprise elements in high oxidation states. Oxygen may alternatively be provided using an ozone source. A plasma source such as an RF plasma source may also be used to deliver the nitrogen component vapour, if a nitrogen-doped lithium borosilicate compound is to be formed.

Electron beam evaporators and Knudsen cells (K-Cells) are other examples of vapour sources; these are well-suited for materials with low partial pressures. In both cases the material is held in a crucible and heated to generate a flux of material. A Knudsen cell uses a series of heating filaments around the crucible, whereas in an electron beam evaporator the heating is achieved by using magnets to direct a beam of high energy electrons onto the material.

Other example vapour sources are effusion cells and cracking sources. Embodiments of the invention eliminate any need for cracking, however, and thereby avoid the complexity inherent in the use of such sources. Further alternative vapour sources will be evident to the skilled person.

During the deposition process, a controlled flow rate or flux of each component element is released from its respective vapour source 18-28 onto the heated substrate 14, whereupon the various elements are co-deposited.

As described herein, the rate of flow of the oxygen is at least about $8\times10^{-8}$ m$^3$/s. In some embodiments, the rate of flow of oxygen is at least about 5 sccm (standard cubic centimetres per minute).

In some embodiments, the rate of flow of oxygen is at least about $0.9\times10^{-8}$ m$^3$/s. In some embodiments, the rate of flow of oxygen is at least about $1\times10^{-7}$ m$^3$/s. In some embodiments, the rate of flow of oxygen is at least about $1.05\times10^{-7}$ m$^3$/s. In some embodiments, the rate of flow of oxygen is at least about $1.1\times10^{-7}$ m$^3$/s. In some embodiments, the rate of flow of oxygen is at least about $1.15\times10^{-7}$ m$^3$/s. In some embodiments, the rate of flow of oxygen is at least about $1.2\times10^{-7}$ m$^3$/s. In some embodiments, the rate of flow of oxygen is at least about $1.25\times10^{-7}$ m$^3$/s. In some embodiments, the rate of flow of oxygen is at least about $1.3\times10^{-7}$ m$^3$/s. In some embodiments, the rate of flow of oxygen is at least about $1.35\times10^{-7}$ m$^3$/s. In some embodiments, the rate of flow of oxygen is at least about $1.4\times10^{-7}$ m$^3$/s. In some embodiments, the rate of flow of oxygen is at least about $1.5\times10^{-7}$ m$^3$/s.

In some embodiments, the rate of flow of oxygen is from about $8\times10^{-8}$ m$^3$/s to about $2\times10^{-7}$ m$^3$/s. In some embodiments, the rate of flow of oxygen is from about $8\times10^{-8}$ m$^3$/s to about $1.9\times10^{-7}$ m$^3$/s. In some embodiments, the rate of flow of oxygen is from about $8\times10^{-8}$ m$^3$/s to about $1.8\times10^{-7}$ m$^3$/s. In some embodiments, the rate of flow of oxygen is from about $8\times10^{-8}$ m$^3$/s to about $1.7\times10^{-7}$ m$^3$/s. In some embodiments, the rate of flow of oxygen is from about $1\times10^{-7}$ m$^3$/s to about $1.65\times10^{-7}$ m$^3$/s. In some embodiments, the rate of flow of oxygen is from about $1.1\times10^{-7}$ m$^3$/s to about $1.7\times10^{-7}$ m$^3$/s. In some embodiments, the rate of flow of oxygen is from about $1.15\times10^{-7}$ m$^3$/s to about $1.65\times10^{-7}$ m$^3$/s. In some embodiments, the rate of flow of oxygen is from about $1.2\times10^{-7}$ m$^3$/s to about $1.6\times10^{-7}$ m$^3$/s.

In some embodiments, the rate of flow of oxygen is from about $1.25\times10^{-7}$ m$^3$/s to about $2\times10^{-7}$ m$^3$/s. In some embodiments, the rate of flow of oxygen is from about $1.25\times10^{-7}$ m$^3$/s to about $1.7\times10^{-7}$ m$^3$/s.

The rate of flow of the other vapour sources, such as the source of lithium, source of boron and source of silicon, may be the same as or different to the rate of flow of the oxygen. As the skilled person will appreciate, the rate of flow of the vapour sources other than oxygen may affect the film composition and structure. At too high a rate of the other sources, the concentration of Li, B, Si will exceed the availability of oxygen and in the extreme the film would no longer be an oxide. In some embodiments, the rate of flow of lithium is from about $0.9\times10^{-10}$ m/s to about $10\times10^{-10}$ m/s, such as from about $2.5\times10^{-10}$ m/s to about $3.5\times10^{-10}$ m/s. In some embodiments, the rate of flow of boron is from about $0.01\times10^{-10}$ m/s to about $1.5\times10^{-10}$ m/s, such as from about $0.1\times10^{-10}$ m/s to about $0.2\times10^{-10}$ m/s. In some embodiments, the rate of flow of silicon is from about $0.01\times10^{-10}$ m/s to about $1.5\times10^{-10}$ m/s, such as from about $0.3\times10^{-10}$ m/s to about $0.4\times10^{-10}$ m/s.

The elements then react on the substrate 14 to form a thin film layer 29 of the amorphous lithium borosilicate or doped lithium borosilicate compound.

In some embodiments, co-depositing the component elements onto the substrate comprises co-depositing the component elements directly onto a surface of the substrate. In some embodiments, co-depositing the component elements onto the substrate comprises co-depositing the component elements onto one or more layers supported on the substrate.

In some embodiments, the substrate is coated with a layer of the amorphous compound as described herein. In some embodiments, the amorphous compound entirely coats the surface of the substrate. In some embodiments, the amorphous compound partially covers the surface of the substrate.

In some embodiments, the substrate is or comprises lithium. In some embodiments, the substrate comprises lithium. In some embodiments, the substrate consists essentially of lithium. In some embodiments, the substrate consists of lithium.

The reaction of the component elements to form the compound occurs on the surface of the substrate rather than in the vapour phase prior to deposition on the substrate. While not wishing to be bound by theory, it is believed that each component element in the vapour form collides with and adheres to the surface of the substrate, where the atoms of each element are then mobile on the surface and so are able to react with each other to form the amorphous compound.

The process is preferably carried out in a high vacuum. As the skilled person understands, the term "high vacuum" means that a pressure of from $1\times10^{-7}$ Torr to $1\times10^{-2}$ Torr ($1.33\times10^{-5}$ Pa to 1.33 Pa). In some embodiments, the total pressure of the chamber is less than about $1\times10^{-1}$ Pa, such as less than about $5\times10^{-2}$ Pa, such as less than about $1\times10^{-2}$ Pa, such as less than about $5\times10^{-3}$ Pa, such as less than about $1\times10^{-3}$ Pa. Performing the process in a partial vacuum ensures that the mean free path of the vapour phase particles (mean distance travelled before collision with another particle) travelling in the vacuum from their respective sources is long so that the chance of collisions between particles prior to deposition on the substrate is minimised. Advantageously, therefore, the distance from the sources to the substrate may be arranged to be less than the mean free path to increase the chance of the particles reaching the substrate without colliding, thereby avoiding vapour phase interactions. Reaction of the component elements may hence be limited to the substrate surface and the quality of the thin film compound material is enhanced.

A significant advantage of the invention is that deposition of the constituents of the compound directly from the elements allows for direct control of the compound composition via the rates of deposition of the component elements. The rate of flow or flux of each element can be independently controlled by appropriate operation of its respective vapour source so that the chemical composition of the deposited compound can be tailored according to exacting requirements if desired. Direct control of the stoichiometry of the deposited compound is therefore possible by controlling the flux, and hence consequently the rate of deposition, of each component element. Conventional deposition techniques such as sputtering and pulsed laser deposition can suffer from preferential loss of lighter elements so control of the proportion of the elements in the final compound is more difficult.

Also, deposition directly from the component elements eliminates the need for sputtering targets or precursors, and additional elements can be incorporated directly with no requirement to prepare new deposition targets. Further, it enables the deposition of smooth dense films with undamaged surfaces. Vapour sources such as those exemplified above produce lower energy particles than those produced by sputtering; this lower energy prevents cluster formation and reduces surface roughness of the deposited thin film, which is also a problem with pulsed laser deposition.

Importantly, the invention allows the formation of amorphous lithium-rich compounds. The amorphous nature makes the compounds suitable for use as electrolytes in thin film batteries. Under conventional synthetic conditions for both bulk and thin film samples, these compounds are known to crystallise which impairs their performance as electrolytes. The present invention is thus beneficial in offering a technique for making lithium-based thin film electrolytes.

Furthermore, due to the low temperature at which the method is carried out, the method can be utilised for preparing materials in which the amorphous compound is deposited on lithium. This affords the potential for the composition prepared to be utilised not only as an electrolyte in a battery, but also as a protectant for electrodes, particularly on the anode of a battery (such as, for example, comprising lithium as the negative electrode material). This also means that the composition prepared may be particularly suitable as an electrolyte in contact with lithium metal in a lithium ion battery.

Composition

As described herein, there is a composition comprising an amorphous lithium borosilicate compound or doped lithium borosilicate compound, wherein the composition is obtained or obtainable by depositing the amorphous compound on a substrate using a vapour deposition method, the method comprising:

providing a vapour source of each component element of the compound, wherein the vapour sources comprise at least a source of lithium, a source of oxygen, a source of boron and a source of silicon, and, optionally, a source of at least one dopant element;

providing a substrate at a temperature of less than about 180° C.;

delivering a flow of said lithium, said oxygen, said boron and said silicon, and, optionally, said dopant element, wherein the rate of flow of said oxygen is at least about $8 \times 10^{-8}$ m$^3$/s; and co-depositing the component elements from the vapour sources onto the substrate wherein the component elements react on the substrate to form the amorphous compound.

Preferably, the vapour source of oxygen is a vapour source of atomic oxygen. In certain embodiments, the vapour source of oxygen is a vapour source of atomic oxygen that comprises a plasma source.

In some embodiments, the amorphous compound does not comprise phosphorus.

The amorphous lithium borosilicate or doped lithium borosilicate compound may be as described hereinabove in respect of the first aspect of the invention.

Preferably, the amorphous compound is lithium borosilicate. The lithium borosilicate composition may be as described hereinabove in respect of the first aspect of the invention.

In some embodiments, the amorphous compound has an ionic conductivity of at least about $1 \times 10^{-7}$ S/cm as measured at 25° C., such as at least about $5 \times 10^{-7}$ S/cm as measured at 25° C., such as at least about $1 \times 10^{-6}$ S/cm as measured at 25° C., such as greater than about $1 \times 10^{-6}$ S/cm at 25° C., such as at least about $1.1 \times 10^{-6}$ S/cm at 25° C., such as at least about $1.2 \times 10^{-6}$ S/cm at 25° C., such as at least about $1.3 \times 10^{-6}$ S/cm at 25° C. In certain cases, the amorphous compound has an ionic conductivity of at least about $3 \times 10^{-6}$ S/cm at 25° C.

Preferably, the amorphous compound has a low electronic conductivity. In some embodiments, the amorphous compound has an electronic conductivity that is less than about $1 \times 10^{-12}$ S/cm as measured at 25° C., such as less than about $2 \times 10^{-13}$ S/cm as measured at 25° C., such as less than about $1 \times 10^{-13}$ S/cm as measured at 25° C., such as less than about $8 \times 10^{-14}$ S/cm as measured at 25° C.

In some embodiments, the amorphous compound is a thin film. In some embodiments, the thin film is between 40 nm and 15,000 nm in thickness, such as between 50 nm and 10,000 nm, such as between 100 nm and 5,000 nm, such as between 200 nm and 4,000 nm, such as between 300 nm and 3,000 nm.

In some embodiments, the amorphous compound is lithium borosilicate or nitrogen-doped lithium borosilicate.

Method of Making Electrode

As described herein, there is provided a method of making a surface-modified electrode by a vapour deposition process, the electrode comprising an electrode active material, wherein a surface of said electrode is modified by an amorphous lithium borosilicate compound or a doped lithium borosilicate compound, wherein the method comprises:

(a) providing a vapour source of each component element of the amorphous compound, wherein the vapour sources comprise at least a source of lithium, a source of oxygen, a source of boron and a source of silicon, and, optionally, a source of at least one dopant element;

(b) providing an electrode at a temperature of less than about 180° C.;

(c) delivering a flow of said lithium, said oxygen, said boron and said silicon, and, optionally, said dopant element, wherein the rate of flow of said oxygen is at least about $8 \times 10^{-8}$ m$^3$/s; and (d) co-depositing the component elements from the vapour sources onto the electrode, wherein the component elements react on the electrode to form the amorphous compound.

As used herein, the term "surface-modified" and "a surface of which is modified by" means that at least a portion of a surface of the electrode is in mechanical or chemical contact with the amorphous compound described herein.

In some embodiments, the step (b) of providing an electrode comprises:

providing first separate vapour sources for each component element of the electrode; and co-depositing the component elements from their separate vapour sources onto a substrate wherein the component elements react on the substrate to form an electrode.

Alternatively, the step (b) of providing an electrode may comprise preparation of the electrode by either thick or thin film processes. These may include, but are not restricted to, physical vapour deposition, chemical vapour deposition, doctor blade casting, tape casting, screen printing, stencil printing, ink jet printing, transfer printing, flexographic printing, spray printing, Gravure printing, Offset printing, and/or Rotary screen printing, whereby the electrode is either a monolith of the electrode active material or a composite comprising electrode active material(s), binder (s), electronic additives, ionic additives which individually or in combination with one another are compatible with the boundary temperature and pressure conditions described herein for the synthesis of the solid state electrolyte materials at low temperatures. The binder materials may comprise organic or inorganic materials (or mixtures thereof) which are compatible with the aforementioned process conditions and have been used to produce thick or thin film composite electrodes independent of or on top of an electrically conductive current collector.

In one embodiment, the method is a method of making a surface-modified negative electrode. In one embodiment, the method is a method of making a surface-modified positive electrode. In one embodiment, the method is a method of making a LiBSiO-surface-modified negative electrode. In another embodiment, the method is a method of making a LiBSiO-surface-modified positive electrode. In one embodiment, the LiBSiO coating is produced by the physical vapour deposition as described herein.

The electrode active material of the electrode is not particularly limited as long as the material allows the amorphous lithium borosilicate or doped lithium borosilicate compound to attach a surface thereto, and is capable of storing and releasing lithium ions. In some embodiments, the surface-modified electrode is a surface-modified negative electrode. Negative electrode active materials may be selected from $Li_4Ti_5O_{12}$, Li, Si, Ge, Sn, Sb, Al, Mg, Bi, Si-M (M=Mg, Al, Sn, Zn, Ag, Fe, Ni, Mn), InSb, metal oxides including: $TiO_2$, vanadium and molybdenum oxides, Ti, Nb oxides ($MgTi_2O_5$, $TiNb_2O_7$), SnO, $SnO_2$, Sb oxides or germanates.

The negative electrode active material used in the battery of the present invention (or in an embodiment of the electrode made according to a method of the present invention) may be lithium or a lithiated transition metal oxide, such as lithium titanium oxide. The negative electrode active material may be a lithium metal alloy, including LiSi, LiSb or LiGe. The negative electrode active material may also be a carbon-containing material (such as activated carbon) capable of reversibly intercalating lithium ions, a tin containing material, a silicon-containing material, or other material.

Negative electrode active materials further include graphite, synthetic graphite, coke, fullerenes, niobium pentoxide, tin alloys, silicon (including amorphous silicon), titanium oxide, tin oxide, and lithium titanium oxide.

Negative electrode active materials comprising elemental carbon materials include graphite, synthetic graphite, coke, fullerenes, carbon nanotubes, other graphitic carbon and combinations thereof. Graphitic carbon refers to any elemental carbon material comprising substantial domains of graphene sheets.

In one embodiment, the negative electrode active material comprises lithium metal, or an alloy thereof. In a further embodiment, the negative electrode may comprise a layer of lithium metal, or a lithium-aluminium alloy. In another embodiment, the negative electrode is lithium. In another embodiment, the negative electrode is a lithium free anode. In another embodiment, the negative electrode is a lithium air anode. In some embodiments, the negative electrode is lithium.

In some embodiments, the electrode is a lithium intercalation electrode. As used herein, the term "intercalation" refers to the reversible inclusion or insertion of a molecule or ion into compounds with layered structures. Therefore, a lithium intercalation electrode may be an electrode in which lithium ions may be reversibly included or inserted into a layered structure, e.g. graphite.

In some embodiments, the surface-modified electrode is a surface-modified positive electrode. A positive electrode active material may include a lithiated transition metal compound, such as a lithium nickel manganese oxide, lithium nickel vanadium oxide, lithium cobalt vanadium oxide, or lithium cobalt phosphate, for example $Li_2NiMn_3O_8$, $LiNiVO_4$, $LiCoVO_4$, $LiCoPO_4$, and the like. Other examples include lithium nickel phosphate, lithium nickel fluorophosphate, and lithium cobalt fluorophosphate; i.e. $LiNiPO_4$, $Li_2NiPO_4F$, $Li_2CoPO_4F$, and the like. The lithium content typically varies depending on the state of charge of the battery. The positive active material may comprise other oxygen-containing materials, such as an oxide, manganate, nickelate, vanadate, phosphate, or fluorophosphate. The positive active material may have the formula $Li_xM_yN_zO$, where M is selected from a group consisting of Ni, Mn, V, and Co, and N is a heteroatomic species different from M, such as Ni, Mn, V, Co, or P. N can be omitted. The positive active material may also be fluorinated, for example as a fluorophosphate.

In one embodiment, the positive electrode active material of a battery of the present invention (or of an electrode provided in an example of the present invention) is selected from the group consisting of $LiCoO_2$, $FeS_2$, $LiCoPO_4$, $LiFePO_4$, $Li_2FeS_2$, $Li_2FeSiO_4$, $LiMn_2O_4$, $LiMnPO_4$, $LiNiPO_4$, $LiV_3O_8$, $LiV_6O_{13}$, $LiVOPO_4$, $LiVOPO_4F$, $Li_3V_2(PO_4)_3$, $MnO_2$, $MoS_3$, S, $TiS_2$, $TiS_3$, $V_2O_5$, $V_6O_{13}$, $LiNi_{0.5}Mn_{1.5}O_4$, and $LiMnNiCoAlO_2$.

In another embodiment, the positive electrode active material of a battery of the present invention (or of an electrode provided in an example of the present invention) is high voltage positive electrode active materials. In a further embodiment, the high voltage positive electrode active material is selected from the group consisting of $LiCoPO_4$, $LiNi_{0.5}Mn_{1.5}O_4$, $LiMnPO_4$, $LiMn_2O_4$, $LiCoO_2$, $LiNi_{1/3}Mn_{1/3}CO_{1/3}O_2$, $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$ and $Li_2FePO_4F$.

In some embodiments, the electrode comprises a positive electrode active material selected from the group consisting of $LiCoPO_4$, $LiNi_{0.5}Mn_{1.5}O_4$, $LiMnPO_4$, $LiCoO_2$, $LiNi_{1/3}Mn_{1/3}CO_{1/3}O_2$, $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$, and $Li_2FePO_4F$.

The amorphous lithium borosilicate or doped lithium borosilicate compound may be any compound as described hereinabove with respect to the first aspect of the invention. In some embodiments, the amorphous compound is lithium borosilicate. In some embodiments, the amorphous compound is nitrogen-doped lithium borosilicate.

In some embodiments, the amorphous lithium borosilicate compound or doped lithium borosilicate compound is provided as a layer on the surface of the electrode. In some embodiments, the amorphous compound is deposited onto one or more layers supported on the substrate layered structure, e.g. graphite.

In some embodiments, the electrode is coated with a layer of the amorphous compound as described herein (such as LiBSiO). In some embodiments, the amorphous compound described herein (such as LiBSiO) is provided as a layer on the surface of the electrode.

In some embodiments, a surface of the electrode is coated with a layer of the amorphous compound (such as LiBSiO) as described herein. This coating may be achieved by first casting an electrode comprising electrode active material (and optionally carbon additive, polymer binder and/or solvent) on a current collector, and then curing and drying the electrode. The surface of the cast electrode may then have a protective layer of the amorphous compound (such as LiBSiO) deposited thereon. In some embodiments, the amorphous compound (such as LiBSiO) entirely coats the surface of the electrode. In some embodiments, the amorphous compound (such as LiBSiO) partially covers the surface of the electrode.

In some preferred embodiments, the amorphous compound is lithium borosilicate, and the electrode comprises lithium.

The method of making a surface-modified electrode may comprise one or more of the optional features of the method for preparing an amorphous lithium borosilicate (LiBSiO) compound or doped lithium borosilicate compound as described above.

Preferably, the vapour source of oxygen is a vapour source of atomic oxygen. In certain embodiments, the vapour source of oxygen is a vapour source of atomic oxygen that comprises a plasma source.

Electrode

Also described herein is an electrode that has been surface-modified. The electrode is surface-modified using a method according to the third aspect of the invention.

The electrode comprises an electrode active material, wherein a surface of said electrode is modified by an amorphous lithium borosilicate compound or doped lithium borosilicate compound as described herein. In some preferred embodiments, a surface of said electrode is modified by a lithium borosilicate compound. The LiBSiO-surface-modified electrode may have improved stability and/or improved cycling over an unmodified electrode, particularly although not exclusively when operated in the presence of an adjacent liquid phase electrolyte material.

In some embodiments, the amorphous compound (such as LiBSiO) is deposited as a layer on the electrode material. As a result, the electrode may be coated with a layer of the amorphous compound. In some embodiments, the amorphous compound entirely coats the surface of the electrode. In some embodiments, the amorphous compound partially covers the surface of the electrode.

In some embodiments, the electrode comprises a negative electrode active material. The negative electrode material may be as described hereinabove. In some embodiments, the electrode comprises a positive electrode active material. The positive electrode active material may be as described hereinabove.

In some preferred embodiments, the amorphous compound is lithium borosilicate, and the electrode comprises lithium.

Method of Making Battery

A further aspect of the invention provides for a method of making a battery. The method comprises depositing an electrolyte of the battery as a layer of an amorphous lithium borosilicate compound or doped lithium borosilicate compound using a vapour deposition method according to the first aspect described hereinabove.

In some embodiments, the battery is a thin film battery. The thin film battery may be produced by sequentially forming films of constituents in all-solid state.

Battery—Surface of Negative and/or Positive Electrode Modified by Amorphous Compound One aspect of the invention relates to a battery comprising a positive electrode, a negative electrode, and an electrolyte between said positive electrode and said negative electrode, wherein at least one of the negative electrode or positive electrode is a surface-modified electrode, wherein the surface-modified electrode is as described herein.

In some embodiments, a surface of at least one of the negative electrode or positive electrode is modified by an amorphous lithium borosilicate compound or doped lithium borosilicate compound as described herein.

In some preferred embodiments, the amorphous compound does not comprise phosphorus. In some preferred embodiments, the amorphous compound is lithium borosilicate. Preferably, the lithium borosilicate composition consists essentially of a system of lithium oxide in combination with silicon oxide and boron oxide, wherein said lithium borosilicate comprises between 70-83 atomic % lithium based on the combined atomic percentages of lithium, boron and silicon, and wherein said lithium borosilicate is a glass.

In one embodiment, the battery comprises a LiBSiO-surface-modified negative electrode.

In one embodiment, the battery comprises a positive electrode, a negative electrode, and an electrolyte between said positive electrode and said negative electrode, wherein the negative electrode is coated with a layer of an amorphous compound as described herein (such as LiBSiO). In one embodiment, the battery comprises a positive electrode, a negative electrode, and an electrolyte between said positive electrode and said negative electrode, wherein the positive electrode is coated with a layer of an amorphous compound as described herein (such as LiBSiO).

In one embodiment, the invention provides a battery comprising a positive current collector, a positive electrode comprising a positive electrode active material, an electrolyte, a negative electrode comprising a negative electrode active material, and a negative current collector, wherein a surface of at least one of the negative electrode or positive electrode is modified by an amorphous compound (such as LiBSiO) as described herein. In one embodiment, the battery comprises a LiBSiO-surface-modified negative electrode. In one embodiment, the battery comprises a LiBSiO-surface-modified positive electrode.

Both the positive electrode (cathode) and negative electrode (anode) may be surface-modified by an amorphous compound (such as LiBSiO) as described herein. For example, in another embodiment, the battery comprises a LiBSiO-surface-modified negative electrode and a LiBSiO-surface-modified positive electrode.

In a further embodiment, the battery is a lithium ion secondary battery. In another embodiment, the lithium ion secondary battery is a thin-film battery.

In one embodiment, the invention provides a battery comprising a positive current collector, a positive electrode comprising a positive electrode active material, an electrolyte, a negative electrode comprising a negative electrode active material, and a negative current collector, wherein the negative electrode is coated with an amorphous compound (such as LiBSiO) of the present invention, e.g., one prepared by a method according to the first aspect. In one embodiment, the battery comprises a LiBSiO-coated negative electrode. In another embodiment, the battery comprises a LiBSiO-coated negative electrode and a LiBSiO-coated positive electrode.

The electrolyte may comprise an organic electrolyte, liquid electrolyte, an ionic liquid, a gel electrolyte, room temperature molten salt, or a solid electrolyte. If the electrolyte is a liquid or gel, then preferably it is a non-aqueous electrolyte. In one embodiment, the electrolyte is an organic electrolyte. In another embodiment, the electrolyte is a liquid electrolyte. In a further embodiment, the liquid electrolyte is a non-aqueous electrolyte. In another embodiment, the electrolyte is a gel electrolyte. In another embodiment, the electrolyte is a molten salt electrolyte. In another embodiment, the electrolyte is a solid electrolyte.

In a further embodiment the liquid, non-aqueous electrolyte comprises a lithium salt and a non-aqueous solvent. Examples of lithium salts include $LiPF_6$, $LiBF_4$, lithium bis(trifluoromethanesulfonyl)amide (LiTFSA, $LiN(CF_3SO_2)_2$), $LiCF_3SO_3$, $LiC_4F_9SO_3$, $LiC(CF_3SO_2)_3$, $LiClO_4$, lithium bis(oxalato)borate (LiBOB), lithium bis(trifluoromethanesulfonyl)imide (LiTFSI), lithium bis(fluorosulfonyl)amide (LiFSA, $LiN(SO_2F)_2$), and $LiCF_3CO_2$. The non-aqueous solvent is capable of dissolving the lithium salt. Examples of the non-aqueous solvent include propylene carbonate, ethylene carbonate, diethyl carbonate, dimethyl carbonate, ethyl methyl carbonate, 1,2-dimethoxyethane, 1,2-diethoxyethane, acetonitrile, propionitrile, tetrahydrofuran, 2-methyltetrahydrofuran, dioxane, 1,3-dioxolane, nitromethane, N,N-dimethyl formamide, dimethyl sulfoxide, sulfolane, vinylene carbonate, and γ-butyrolactone.

In some embodiments, the electrolyte comprises an additive. The electrolyte additive may modify the electrode-electrolyte interface easily and economically. In some embodiment, the electrolyte comprises an additive selected from the group consisting of 4-(trifluoromethyl)-1,3-dioxolan-2-one (TFM-EC), tris(hexafluoro-iso-propyl)phosphate (HFip), 3-hexylthiophene, LiDFOB, tris(trimethylsilyl) phosphate (TMSP), tris(trimethylsilyl)borate (TMSB), and combinations thereof.

Battery—Electrolyte in Form of Layer of Amorphous Lithium Borosilicate Compound or Doped Lithium Borosilicate Compound A further aspect of the invention provides a battery, wherein the battery comprises:
  a positive electrode;
  a negative electrode; and
  an electrolyte;
wherein the electrolyte is in the form of a layer of an amorphous lithium borosilicate compound or doped lithium borosilicate compound deposited on a substrate using a vapour deposition method according to the first aspect of the invention described hereinabove.

In some embodiments, the negative electrode comprises lithium. In some embodiments, the positive electrode comprises lithium. In some embodiments, the positive electrode comprises a positive electrode active material selected from the group consisting of $LiCoPO_4$, $LiNi_{0.5}Mn_{1.5}O_4$, $LiMnPO_4$, $LiCoO_2$, $LiNi_{1/3}Mn_{1/3}Co_{1/3}O_2$, $LiFePO_4$, LiN-$iPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$, and $Li_2FePO_4F$.

In some preferred embodiments, the amorphous compound is lithium borosilicate. The amorphous compound may be as described hereinabove.

In some embodiments, the battery further comprises a positive electrode current collector and a negative electrode current collector. In a further embodiment, the battery further comprises a substrate. In a further embodiment, the battery is encapsulated.

In some embodiments, the battery is a lithium ion battery. In some embodiments, the battery is a lithium ion secondary battery. In some embodiments, the battery is a thin film battery comprising a positive electrode, an electrolyte and a negative electrode. In some embodiments, the battery is an all-solid state battery.

In some embodiments, the battery comprises multiple positive electrode and multiple negative electrodes, such as in a stack. Electrolyte in contact with the electrodes provides ionic conductivity through the separator between electrodes of opposite polarity. The battery generally comprises current collectors associated respectively with a negative electrode and a positive electrode. The stack of electrodes with their associated current collectors and separator are generally placed within a container with the amorphous compound electrolyte.

In some embodiments, the battery is an improved lithium ion battery comprising a negative electrode, a positive electrode, and an electrolyte comprising an amorphous compound (such as LiBSiO) as described herein, wherein the positive electrode comprises a high voltage positive active material having an electrochemical potential of at least 3.5 V versus $Li/Li^+$; at least 4.0 V versus $Li/Li^+$; at least 4.5 V versus $Li/Li^+$; at least 5.5 V versus $Li/Li^+$; or between 6.0-8.5 V versus $Li/Li^+$.

A Li-ion battery with an amorphous compound electrolyte (such as LiBSiO electrolyte) as described herein and a high voltage positive electrode allows development of a high energy/power density Li-ion battery. Furthermore, the amorphous compounds obtained or obtainable according to the method as described herein may have very high ionic conductivity and low electrical conductivity, and so may provide improved performance, such as higher power and energy as well as stable low capacity. For high voltage operation, another significant aspect of the electrolyte properties is the reductive and oxidative stability. The improved reductive and oxidative stability improves cycling performance and life of the battery of the invention.

The negative electrode and positive electrode may be as described hereinabove.

Each of the ranges as described herein may be taken alone or combined with one or more other component ranges to provide a preferred aspect of the invention.

EXAMPLES

The invention will now be described with reference to the following non-limiting examples.

Experimental Methods and Materials

Several samples of uniform thin films of amorphous lithium borosilicate were prepared at a range of substrate temperature using vapour deposition of the component elements (Li, S, B and O) in line with the embodiments described above, and characterised using Raman spectroscopy to determine their structure and properties.

The depositions were carried out in a physical vapour deposition (PVD) system which has been previously described in the literature (Guerin, S. and Hayden, B. E., *Journal of Combinatorial Chemistry* 8, 2006, pages 66-73). The samples were prepared under high vacuum conditions and using a physical vapour deposition process comprising the co-evaporation of the elements lithium, boron, and silicon in the presence of an oxygen plasma source onto a substrate.

Excluding the temperature and oxygen flow rates, all samples were deposited under identical conditions, utilising an oxygen plasma source as a source of atomic oxygen. The plasma atom source converts $O_2(g)$ into a flux of oxygen atoms, radicals and ions directed at the substrate. The oxide materials, lithium silicate and lithium borate, require the highest oxidation states of both silicon and boron (4+ and 3+ respectively), and the use of atomic oxygen rather than molecular oxygen therefore removes the dissociation step required to break $O_2$ to 2O and provides a highly reactive species to oxidize silicon and boron into their highest oxidation states, as required in the materials lithium silicate and lithium borate. The lithium was evaporated from a Knudsen cell, while the boron and silicon were each evaporated from electron beam sources. The rate of deposition of the lithium was controlled by varying the temperature of the Knudsen source while those of the boron and silicon were controlled according to the power of the electron beam power supply. The rates of the sources were determined using quartz crystal microbalances placed directly beneath the substrate onto which the films were deposited.

Oxygen was incorporated into the films using an atom (i.e. plasma) source operating at a power of 600 W with an $O_2(g)$ flow rate ranging from 5 sccm to 10 sccm.

The substrates used throughout were stainless steel substrates (type ss304). The substrates had the following composition: 9.25 wt % Ni, 19 wt % Cr, 1 wt % Si, 2 wt % Mn, 0.08 wt % C, 0.045 wt % P, 0.03 wt % S and 68.595 wt % Fe. The substrates had a thickness of 0.51 mm and a diameter of 15.85 mm.

The elemental compositions of samples were measured by Laser Ablation Inductively Coupled Plasma Mass Spectroscopy (ICP-MS) using a Perkin Elmer Elan 9000 ICP-MS equipped with a New Wave 213 nm laser. The ICP-MS analysis was done with reference to a pellet comprising NIST610 standard reference material.

The sample thicknesses were measured by ellipsometry (Woollam M-200FI Spectroscopic Ellipsometer). Using deposition times of 60 to 840 min, films were deposited with thicknesses ranging from 350 to 2688 nm.

Impedance measurements were carried out on the materials deposited in order to measure the ionic conductivity of the materials. Such impedance measurements were carried out using a Solartron 1260 Impedance Analyser. The solid state electrolyte was sandwiched between a stainless steel or platinum-coated substrate (bottom electrode) and platinum top electrode. The solid state electrolyte continuously covered the base stainless steel electrode whilst discrete top platinum electrodes were deposited using RF sputtering. The impedance was measured using an AC excitation potential of 150 mV across a frequency range of 1 MHz to 0.01 Hz. The response at each frequency was determined using a five second integration time. Seven frequencies were measured per decade with logarithmic spacing between the upper and lower frequency limits.

Electronic conductivity of the materials was measured using a Keithley 1600 sourcemeter by applying a constant potential of 1 V between the platinum upper electrode and the stainless steel bottom electrode, and monitoring the current as a function of time. The steady-state current was used in conjunction with the applied voltage to determine the DC electronic conductivity.

Example 1

In this Example, the process of the present invention was used to deposit lithium borosilicate onto a substrate. Several samples were prepared, each comprising different atomic percentages of lithium, boron and silicon. For each of the samples prepared using the vapour deposition method described herein, the rates of the sources were adjusted such that the composition of the resulting film had between 70 and 79.5 at. % lithium, 8.3 and 18.9 at. % boron, and 8.3 and 15.3 at. % silicon, not accounting for the contribution of oxygen to the stoichiometry of the materials and assuming it is present in quantities appropriate for the maintenance of electroneutrality.

The substrate onto which the elements impinged was maintained at a constant temperature of between 80 and 110° C. throughout the deposition methods using a heating element positioned behind the substrate on which the films were grown. A comparative example (sample E) was prepared by depositing the elements onto a substrate that was heated to a temperature of 180° C. using said heating element.

Figure 2:
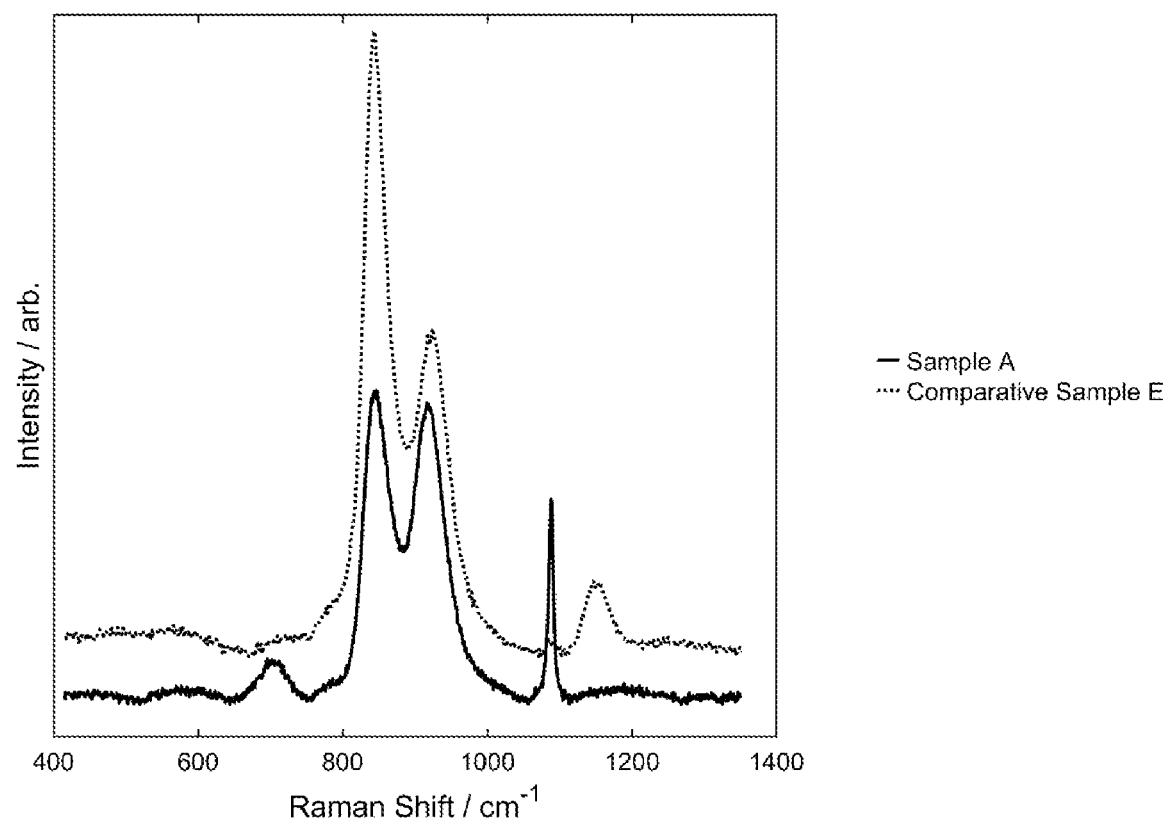
FIG. 2 shows the Raman spectra observed for (a) a lithium borosilicate sample deposited at a temperature of 180° C., and (b) a lithium borosilicate sample deposited at a temperature of 110° C.

The Raman spectra observed for the as-deposited LiBSiO of sample A (see table below) are shown in FIG. 2. This FIG. 2 also provides a comparative spectrum for a comparative sample E that comprises 77.2 at % lithium, 8.7 at % boron and 14.1 at %. Sample E was prepared using the same method as described above for samples A to D, but was carried out with the stainless steel substrate being heated to a temperature of 180° C. The deposition time was 25,200 seconds, and the thickness of the film was 2,000 nm.

For sample A, the band at approximately 840 cm$^{-1}$ indicates the presence of the pyro-B component, that at approximately 860 cm$^{-1}$ indicates the presence of an ortho-Si component, that at approximately 915 cm$^{-1}$ indicates the presence of a pyro-Si component, and that at approximately 930 cm$^{-1}$ indicates the presence of pyro-B. As is clear from FIG. 4, the comparative sample E made a high temperature of 180° C. has a relative dominance of borate type groups (pyroborate (841 and 1148 cm$^{-1}$) and 6-membered borate rings (789 cm$^{-1}$)). The sample A of the invention made at low temperature (110° C.) has a relative dominance of silicate type groups (Si—O—SI (703 cm$^{-1}$) and orthosilicate (859 cm$^{-1}$)). Without being bound, the distribution of constituent groups may reflect underlying differences in the equilibrium thermodynamics promoted by the deposition conditions, but may also be a by-product of the kinetic considerations associated with the relative abundance of oxygen and the mobilities of the different adatoms during the course of film growth.

The results of impedance and DC measurements, together with compositional analysis and film thickness for each sample are shown in Table 1 below.

Figure 3A:
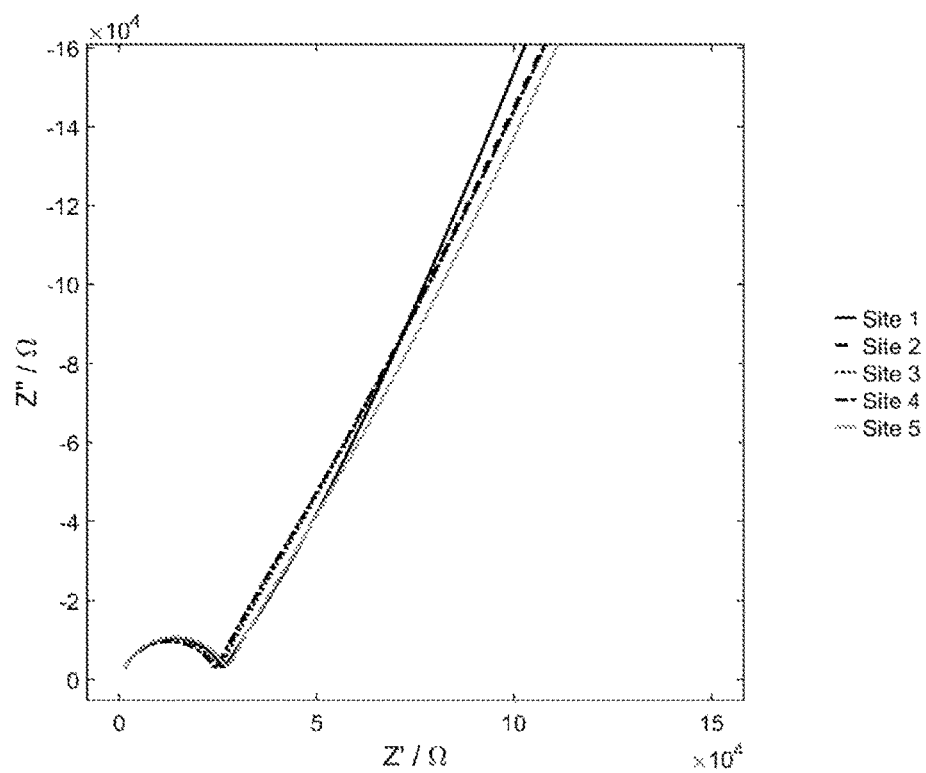
FIG. 3A shows the electrical AC response of a sample of lithium borosilicate (sample A, measured at five different sites) used to determine the ionic conductivity.
Figure 3B:
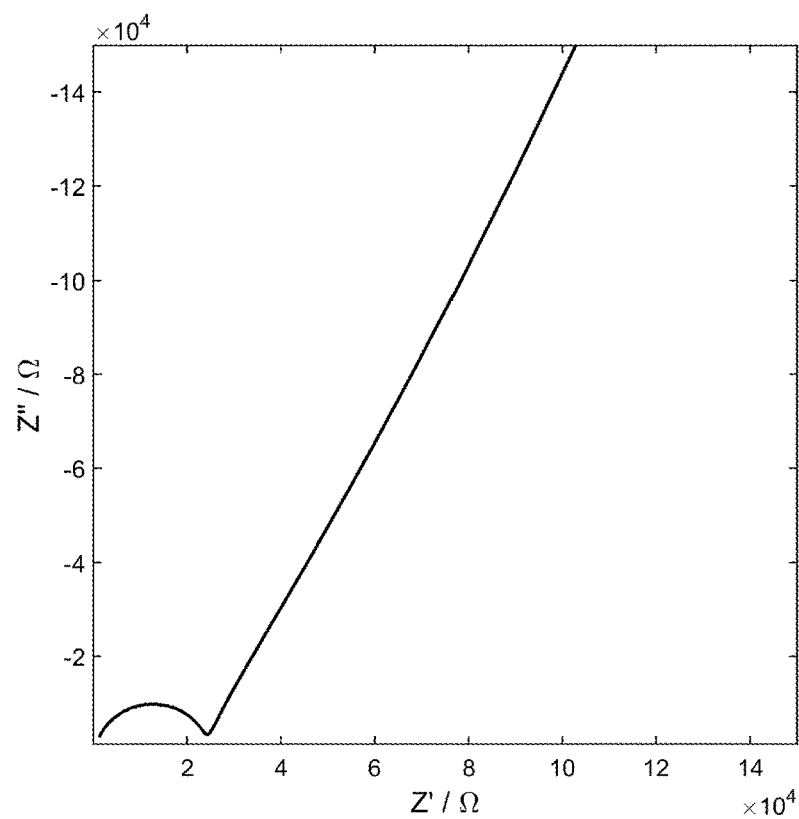
FIG. 3B shows the electrical AC response of sample A as measured at site 2, used to determine the ionic conductivity

A Nyquist diagram for Sample A (sites 1 to 5) is shown in FIG. 3A, in order to determine the ionic conductivity of sample A. In this diagram, Z' (the real part of the complex impedance) is plotted against Z" (the imaginary part of the complex impedance). The scale was reduced to allow observation of the high frequency response 1 MHz-5.17947 Hz. The ionic conductivity of sample A (site 2) is shown in FIG. 3B. It is clear from these Figures that the samples are capacitive. The resistance was determined by fitting the experimental data with an equivalent circuit-based model. The value of the resistance used to determine the conductivity is similar to the value of the x-intercept on the graphs, while taking into account ohmic loss contributions. Ionic conductivity was then calculated using the following formula:

$$\sigma = \frac{T}{R \times A}$$

where σ is the ionic conductivity, T is the thickness of the sample, R is the resistance and A is the area of the sample.

Figure 4:
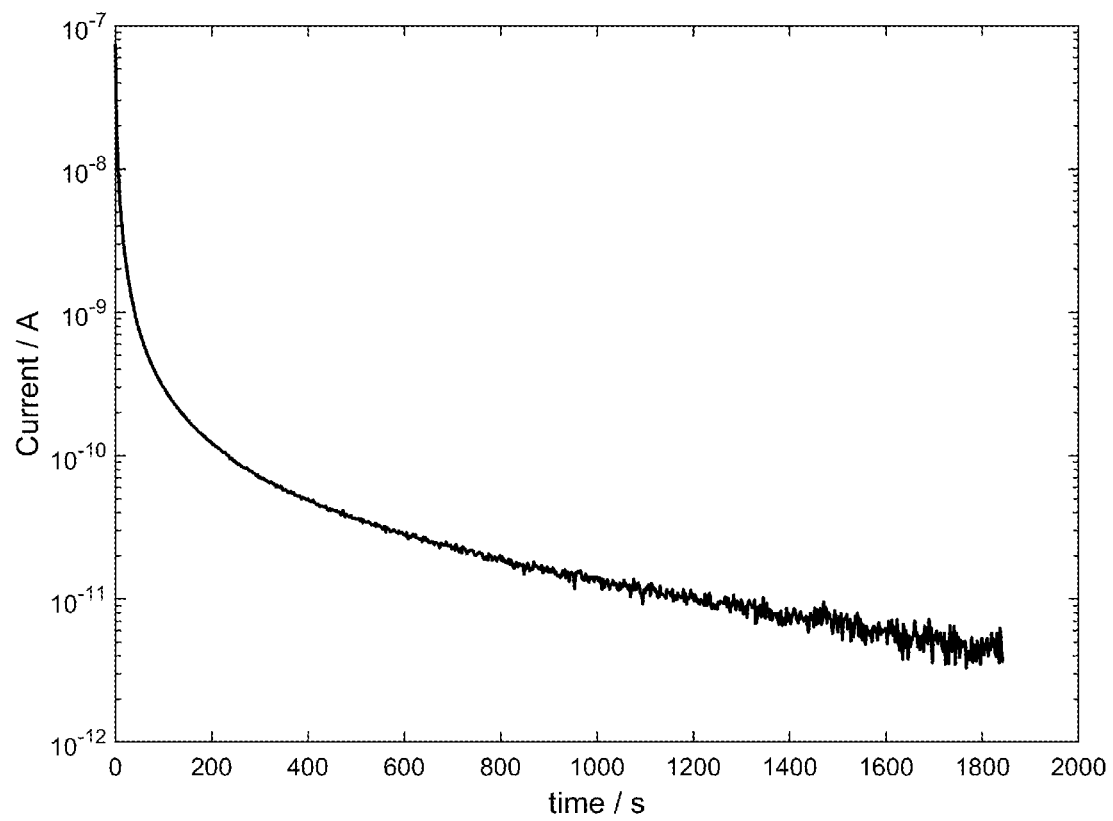
FIG. 4 shows the electrical DC response of a sample of lithium borosilicate (sample A).

FIG. 4 shows the electronic resistance measurements for Sample A. Current is plotted as a function of time upon application of 1 V potential to Sample A. The electronic conductivity is determined by using the long-time value of current and using Ohm's law ($R_{electronic}=V/I$) to determine the electronic resistance from which the electronic conductivity is determined according to:

$$\sigma_{electronic} = \frac{\text{thickness of sample}}{R_{electronic} \times \text{electrode area}}$$

TABLE 1 electronic properties of lithium borosilicate samples prepared using PVD at low temperatures

| Sample | Site Measured | Li (at %) | B (at %) | Si (at %) | Temp (° C.) | Oxygen Flow Rate (sccm) | Oxygen Flow Rate (m³/s) | Film thickness (nm) | Deposition Time (s) | Rate (nm/s) | Ionic Conductivity (S/cm) | Electronic Conductivity (S/cm) |
|---|---|---|---|---|---|---|---|---|---|---|---|---|
| A | 1 | 76.4 | 8.3 | 15.3 | 110 | 8.8 | $1.47 \times 10^{-7}$ | 2688 | 50400 | 0.053 | $1.01 \times 10^{-6}$ | $5 \times 10^{-14}$ |
|   | 2 |   |   |   |   |   |   |   |   |   | $1.15 \times 10^{-6}$ |   |
|   | 3 |   |   |   |   |   |   |   |   |   | $1.10 \times 10^{-6}$ |   |
|   | 4 |   |   |   |   |   |   |   |   |   | $1.13 \times 10^{-6}$ |   |
|   | 5 |   |   |   |   |   |   |   |   |   | $1.05 \times 10^{-6}$ |   |
| B | 1 | 79.5 | 12.0 | 8.5 | 80 | 8.8 | $1.47 \times 10^{-7}$ | 385 | 3600 | 0.107 | $2.79 \times 10^{-6}$ |   |
|   | 2 |   |   |   |   |   |   |   |   |   | $2.46 \times 10^{-6}$ |   |
|   | 3 |   |   |   |   |   |   |   |   |   | $2.36 \times 10^{-6}$ |   |
|   | 4 |   |   |   |   |   |   |   |   |   | $5.58 \times 10^{-7}$ |   |
| C | 1 | 74.2 | 11.7 | 14.2 | 110 | 9.4 | $1.57 \times 10^{-7}$ | 490 | 3600 | 0.136 | $7 \times 10^{-7}$ |   |
| D | 1 | 77.8 | 13.0 | 9.2 | 110 | 8.4 | $1.4 \times 10^{-7}$ | 371 | 3600 | 0.103 | $1.37 \times 10^{-6}$ |   |

It can be seen from the above that, even at the low temperatures used, the ionic conductivity measured for the samples prepared is above $5 \times 10^{-7}$ S/cm, and for the majority of samples above $1 \times 10^{-6}$ S/cm. In each case, the rate of flow of oxygen is at least $8 \times 10^{-8}$ m³/s. Effectively, the rate of flow of oxygen corresponds to the rate at which molecular oxygen is supplied to the plasma source.

It can be seen from the above that, even at the low temperatures used, the ionic conductivity measured for the samples prepared is above $5 \times 10^{-7}$ S/cm, and for the majority of samples above $1 \times 10^{-6}$ S/cm. In each case, the rate of flow of oxygen is at least $8 \times 10^{-8}$ m³/s. Effectively, the rate of flow of oxygen corresponds to the rate at which molecular oxygen is supplied to the plasma source.

The maximum and minimum values of the total chamber pressure ($P_{CH}$) during the deposition of the above samples are provided in the table below.

| Sample | $P_{CH}$(max) | $P_{CH}$(min) |
|---|---|---|
| A | $5.33 \times 10^{-3}$ | $5.20 \times 10^{-3}$ |
| B | $4.80 \times 10^{-3}$ | $4.80 \times 10^{-3}$ |
| C | $4.93 \times 10^{-3}$ | $4.93 \times 10^{-3}$ |
| D | $4.80 \times 10^{-3}$ | $4.80 \times 10^{-3}$ |

The preparation of materials having an ionic conductivity of at least $5 \times 10^{-7}$ S/cm affords the potential for such materials to be used in solid state batteries. The utilisation of low temperatures of less than 180° C. means that such materials can be deposited on lithium substrates, which has a melting temperature of around 180° C.

All publications mentioned in the above specification are herein incorporated by reference. Various modifications and variations of the present invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are obvious to those skilled in chemistry, materials science or related fields are intended to be within the scope of the following claims.

The invention claimed is:

1. A vapour deposition method for preparing an amorphous lithium borosilicate compound or doped lithium borosilicate compound, the method comprising:

providing a vapour source of each component element of the compound, wherein the vapour sources comprise at least a source of lithium, a source of oxygen, a source of boron, and a source of silicon, and, optionally, a source of at least one dopant element;

providing a substrate;

delivering a flow of said lithium, said oxygen, said boron and said silicon, and, optionally, said dopant element, wherein the rate of flow of said oxygen is at least about $8 \times 10^{-8}$ m³/s; and co-depositing the component elements from the vapour sources onto the substrate, wherein:

the component elements react on the substrate to form the amorphous compound; and the substrate is provided at a temperature of 110° C. when the component elements from the vapour sources are co-deposited onto the substrate, the temperature of the substrate resulting in a relative dominance of silicate and orthosilicate from the co-deposition of the component elements.

2. The vapour deposition method according to claim 1, wherein the vapour source of atomic oxygen comprises an ozone source.

3. The vapour deposition method according to claim 1, wherein the vapour source of atomic oxygen comprises a plasma source.

4. The vapour deposition method according to claim 1, wherein the rate of flow of said oxygen is at least about $1 \times 10^{-7}$ m³/s.

5. The vapour deposition method according to claim 1, wherein the rate of flow of said oxygen is from about $1.25 \times 10^{-7}$ m³/s to about $2 \times 10^{-7}$ m³/s.

6. The vapour deposition method according to claim 1, wherein the lithium borosilicate consists essentially of a system of lithium oxide in combination with silicon oxide and boron oxide.

7. The vapour deposition method according to claim 1, wherein the lithium borosilicate comprises between 70-83 atomic % lithium based on the combined atomic percentages of lithium, boron and silicon.

8. The vapour deposition method according to claim 1, wherein the lithium borosilicate comprises between 1-25 atomic % boron based on the combined atomic percentages of lithium, boron and silicon.

9. The vapour deposition method according to claim 1, wherein the lithium borosilicate comprises between 1-25 atomic % silicon based on the combined atomic percentages of lithium, boron and silicon.

10. The vapour deposition method according to claim 1, wherein the vapour sources further comprise a source of nitrogen, and the amorphous compound is nitrogen-doped lithium borosilicate.

11. The vapour deposition method according to claim 1, wherein co-depositing the component elements onto the substrate comprises co-depositing the component elements directly onto a surface of the substrate.

12. The vapour deposition method according to claim 1, wherein co-depositing the component elements onto the substrate comprises co-depositing the component elements onto one or more layers supported on the substrate.

13. The vapour deposition method according to claim 1, wherein the substrate is or comprises lithium.

14. A method of making a battery, comprising depositing an electrolyte of the battery as a layer of an amorphous lithium borosilicate compound or doped lithium borosilicate compound using a vapour deposition method according to claim 1.

15. A method of making a surface-modified electrode by a vapour deposition process, the electrode comprising an electrode active material, wherein a surface of said electrode is modified by an amorphous lithium borosilicate compound or doped lithium borosilicate compound, wherein the method comprises:

(a) providing a vapour source of each component element of the amorphous compound, wherein the vapour sources comprise at least a source of lithium, a source of oxygen, a source of boron and a source of silicon, and, optionally, a source of at least one dopant element; wherein the vapour source of oxygen is a vapour source of atomic oxygen;

(b) providing an electrode;

(c) delivering a flow of said lithium, said oxygen, said boron and said silicon, and, optionally, said dopant element, wherein the rate of flow of said oxygen is at least about $8 \times 10^{-8}$ m$^3$/s; and (d) co-depositing the component elements from the vapour sources onto the electrode, wherein:

the component elements react on the electrode to form the amorphous compound; and the electrode is provided at a temperature of 110° C. when the component elements from the vapour sources are co-deposited onto the electrode, the temperature the substrate resulting in a relative dominance of silicate and orthosilicate from the co-deposition of the component elements.

* * * * *